US 11,438,006 B2

United States Patent
Williams, III et al.

(10) Patent No.: US 11,438,006 B2
(45) Date of Patent: Sep. 6, 2022

(54) METHOD TO OPERATE AN OPTICAL SENSOR ARRANGEMENT WITH IMPROVED CONVERSION ACCURACY AND OPTICAL SENSOR ARRANGEMENT

(71) Applicant: ams International AG, Rapperswil (CH)

(72) Inventors: Louis Albert Williams, III, Rapperswil (CH); Yong Han, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 162 days.

(21) Appl. No.: 16/955,343

(22) PCT Filed: Dec. 18, 2018

(86) PCT No.: PCT/EP2018/085561
§ 371 (c)(1),
(2) Date: Jun. 18, 2020

(87) PCT Pub. No.: WO2019/121728
PCT Pub. Date: Jun. 27, 2019

(65) Prior Publication Data
US 2021/0091783 A1    Mar. 25, 2021

Related U.S. Application Data
(60) Provisional application No. 62/609,228, filed on Dec. 21, 2017.

(51) Int. Cl.
*H03M 1/72*    (2006.01)
*H03M 1/52*    (2006.01)
(Continued)

(52) U.S. Cl.
CPC .............. *H03M 1/52* (2013.01); *G01J 1/46* (2013.01); *H03M 1/468* (2013.01); *H04N 5/378* (2013.01);
(Continued)

(58) Field of Classification Search
CPC ........ H03M 1/60; H03M 1/141; H03M 1/125; H03M 1/0609; H03M 1/52; H03M 1/56;
(Continued)

(56) References Cited

U.S. PATENT DOCUMENTS 6,366,231 B1 *  4/2002  Rao .......................... H03M 1/60
                                                        341/166
7,164,379 B1 *  1/2007  Rao .......................... H03M 1/52
                                                        341/161

(Continued)

FOREIGN PATENT DOCUMENTS

EP        2863192 A1    4/2015

OTHER PUBLICATIONS

European Patent Office, International Search Report for PCT/EP2018/085561 dated Apr. 10, 2 019.

*Primary Examiner* — Linh V Nguyen
(74) *Attorney, Agent, or Firm* — MH2 Technology Law Group LLP

(57) ABSTRACT

An optical sensor arrangement comprises a photodiode and a converter arrangement including an integration amplifier, a comparator amplifier, an integration capacitor and a result register. During a precharge phase the result register is set to a starting value. During an integration phase a current is sampled through the photodiode to update the result register in response to down charges applied to an input of the integration amplifier. During a residue phase the result register is updated in dependence on the charge remaining (Continued)

on the integration capacitor. Measuring the residual charge increases resolution and accuracy of the converter.

17 Claims, 22 Drawing Sheets

(51) Int. Cl.
G01J 1/46 (2006.01)
H03M 1/46 (2006.01)
H04N 5/3745 (2011.01)
H04N 5/378 (2011.01)
G01J 1/44 (2006.01)

(52) U.S. Cl.
CPC .... *H04N 5/37455* (2013.01); *G01J 2001/444* (2013.01); *G01J 2001/446* (2013.01)

(58) Field of Classification Search
CPC .... H03M 1/002; H03M 1/1014; H03M 1/123; H03M 1/1245; H03M 1/145; H03M 1/403; H03M 1/466; H03M 1/54; H03M 1/68; H03M 1/86; H04N 5/378; H04N 5/374; H04N 5/37455; H04N 5/3745; H04N 5/3575; H04N 5/335; H04N 5/3765; H04N 5/357; H04N 5/37457; H04N 5/3698; H04N 5/363
USPC ....... 341/155, 156, 157, 161, 162, 166, 167, 341/172
See application file for complete search history.

(56) References Cited

U.S. PATENT DOCUMENTS

| 7,372,392 | B1* | 5/2008 | Wan ............... H03F 3/45183 341/172 |
| 7,388,413 | B1* | 6/2008 | Ball ................. H03K 4/501 327/131 |
| 7,936,299 | B2* | 5/2011 | Astley .............. H03M 1/60 341/172 |
| 8,294,607 | B2* | 10/2012 | Rao ................. H03M 1/123 341/169 |
| 10,107,921 | B1* | 10/2018 | Proksa ............ H04N 5/378 |
| 10,261,195 | B2* | 4/2019 | Chappo ............ H04N 5/32 |
| 11,326,942 | B2* | 5/2022 | Xu ................ H04N 5/37455 |
| 2016/0309140 | A1* | 10/2016 | Wang ............. H04N 5/3765 |

* cited by examiner

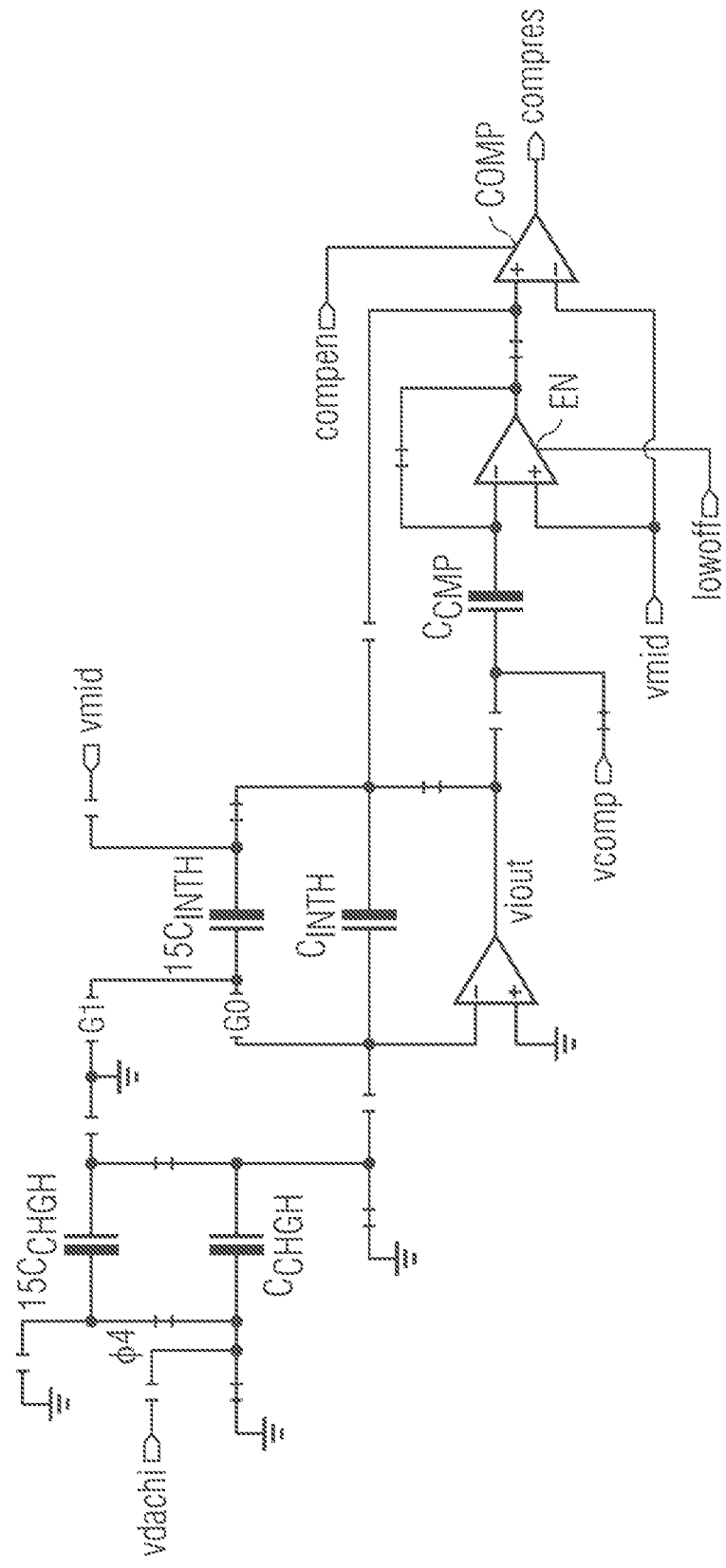

METHOD TO OPERATE AN OPTICAL SENSOR ARRANGEMENT WITH IMPROVED CONVERSION ACCURACY AND OPTICAL SENSOR ARRANGEMENT

CROSS-REFERENCE TO RELATED APPLICATIONS

The present application is the national stage entry of International Patent Application No. PCT/EP2018/085561, filed on Dec. 18, 2018, which claims benefit of priority of U.S. Patent Application No. 62/609,228 filed on Dec. 21, 2017, all of which are hereby incorporated by reference in their entirety for all purposes.

TECHNICAL FIELD

The present disclosure relates to a current-to-digital conversion in photodiode-based light sensors. Specifically, this disclosure relates to an optical sensor arrangement that includes a photodiode, a converter arrangement comprising an integration amplifier, a comparator amplifier and integration and comparator capacitors. A controller operates the converter arrangement to perform an integrating process. This disclosure concerns a method to operate such a sensor arrangement and the sensor arrangement to be used in the method.

BACKGROUND

Light-to-digital (LDC) converters are widely used in electronic devices such as smartphones or computer displays to control their operation dependent on the ambient light conditions. The LDC converter may include a converter arrangement that measures the current through a photodiode to generate a value that is indicative of the amount of ambient light impinging on the photodiode. Existing solutions measure the light intensity by counting a discrete number of charge packets that offset the photodiode current. The resolution is limited by the charge packet size, and charge left on the integrator at the end of a measurement cycle is neglected.

SUMMARY

According to an embodiment, a method to operate an optical sensor arrangement, wherein the optical sensor arrangement comprises a photodiode; a converter arrangement, that comprises: an integration amplifier and a comparator amplifier; an integration capacitor coupled to an input of the integration amplifier; a comparator capacitor coupled to an input of the comparator amplifier;

a controller to operate the converter arrangement; and a result register; wherein the method performs a precharge phase to set the result register to a starting value; an integration phase to sample a current through the photodiode and update the result register in response to down charges applied to an input of the integration amplifier; and a residue phase to update the result register in dependence on the charge remaining on the integration capacitor.

This solution measures the left-over charge on the integrator at the end of a light measurement to increase the effective resolution without reducing the maximum light level that can be processed.

According to embodiment, this solution uses a successive approximation search algorithm at the end of the diode current integration cycle to measure the "residue" charge. A ½-bit per step search algorithm is used to provide error correction if a "wrong" decision is made. A "lift" step is implemented when the search algorithm is raising the output voltage in order to keep the switch transistors from leaking current to ground through the drain to substrate diode. A pre-charge phase is used to provide a starting point for the residue algorithm that makes the residue computation less sensitive to comparator offset. Lastly, the light-to-digital converter has two sizes of capacitors for different gain settings, and a sampling mechanism is used to always allow the use of the larger capacitors during the residue phase. This improves immunity to switch charge injection.

According to this solution, it measures the residual charge left on a photodiode integrator at the end of an integration cycle. Previous solutions simply neglected the residual charge. By measuring the residual charge, this converter can increase its resolution without requiring a longer integration time.

According to an embodiment, the step of performing a precharge phase comprises the steps of: setting an output of the integration amplifier to a reference potential; applying a predetermined charge to change the potential at the output of the integration amplifier; performing a search algorithm to return the output viout of the integrator to the reference potential vmid; and applying another predetermined charge to change the potential at the output of the integration amplifier and setting the result register in response to the other predetermined charge.

According to an embodiment, the step of performing a precharge phase further comprises the steps of: applying a down charge to the input of the integration amplifier and performing a ½ bit per step search algorithm to return the output of the integrator to the reference potential vmid.

According to an embodiment, the step of applying a predetermined charge comprises applying a down charge to lower the output viout of the integration amplifier by ¼ count and the step of applying another predetermined charge comprises applying a down charge to lower the output of the integration amplifier by ½ count and setting the result register to +0.5 counts.

According to an embodiment, the step of performing an integration phase comprises the steps of: connecting the photodiode to the input of the integration amplifier; comparing the output viout of the integration amplifier with a reference potential vmid; and updating the result register in response to the step of comparing.

According to an embodiment, the step of performing an integration phase comprises repetitively performing the steps of comparing the output of the integration amplifier with a reference potential vmid and changing the result register during a predetermined integration time.

According to an embodiment, the step of performing a residue phase comprises the steps of: performing a search algorithm to return the output of the integrator to a reference potential vmid; and applying a predetermined charge to change the potential at the output viout of the integrating amplifier and setting the result register in response to the predetermined charge.

According to an embodiment, the step of performing a residue phase further comprises the steps of: performing a ½ bit per step search algorithm to return the output of the integrator to the reference potential and updating the result register by an amount proportional to one of an up charge and a down charge applied to the input of the integration amplifier during the step of performing a ½ bit per step search algorithm.

According to an embodiment, the step of performing a ½ bit per step search algorithm to return the output of the integrator to the reference potential comprises: connecting the comparator capacitor to the output of the integration amplifier and comparing an output signal viout of the integration amplifier with a reference potential vmid; applying one of a down charge and an up charge and, in dependence on the result of comparing, applying a lift potential vlift to another input of the integration amplifier.

According to an embodiment, an optical sensor arrangement comprises: a photodiode; a converter arrangement, comprising: an integration amplifier and a comparator amplifier; an integration capacitor coupled to an input of the integration amplifier; a comparator capacitor coupled to an input of the comparator amplifier; a controller to operate the converter arrangement; and a result register; the converter arrangement configured to set the result register to a starting value during a precharge phase; update the result register in response to down charges applied to an input of the integration amplifier in response to sampling a current through the photodiode during an integration phase; and update the result register in dependence on the charge remaining on the integration capacitor during a residue phase.

According to an embodiment, the converter arrangement is configured to perform a search algorithm to return an output of the integration amplifier to a reference potential vmid during the precharge phase and during the residue phase.

According to an embodiment, the converter arrangement is configured to adopt one or more of a residue down charge configuration, a residue up charge configuration and a residue lift charge configuration during the precharge phase and during the residue phase.

According to embodiments, in the residue down charge configuration, a charge redistribution capacitor is connected to the input of the integration amplifier and to a reference potential and another input of the integration amplifier is connected to ground potential. In the residue up charge configuration, a charge redistribution capacitor is connected to the input of the integration amplifier and to ground potential and another input of the integration amplifier is connected to ground potential. In the residue lift charge configuration, a charge redistribution capacitor is connected to ground potential and to the input of the integration amplifier and another input of the integration amplifier is connected to a lift potential vlift.

An application of the optical sensor arrangement is given with a mobile communication device. The optical sensor arrangement supplies a signal indicative of ambient light to control the brightness of a display screen of the mobile communication device.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

BRIEF DESCRIPTION OF THE DRAWINGS

In the drawings:

FIG. 5 shows a configuration of the core analog circuit of FIG. 1 used during the residue phase;

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
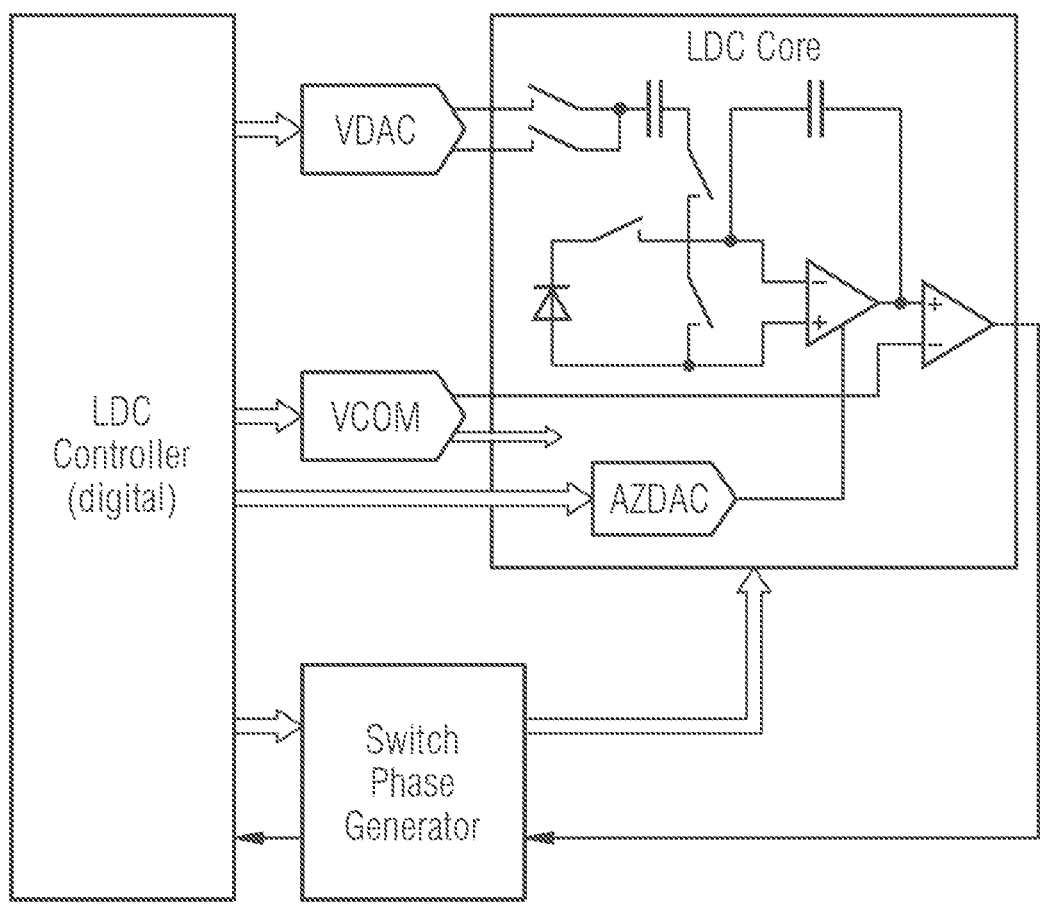
FIG. 1 shows a principle top level block diagram of a light-to-digital (LDC) converter.

The light-to-digital converter (LDC) architecture is shown in FIG. 1. It comprises the following elements. There is a digital LDC controller that manages the switch timing, DAC settings, and result computation. There is VCOM digital-to-analog converter (DAC) that generates the voltages vcomp, vmid, and vlift described below. There is a VDAC digital-to-analog converter that generates the voltages vdachi and vdaclo that are to generate charge packets that are used during the conversion process. There is a switch phase generator that takes the single phase control from the digital controller and generates non-overlapping and delayed clock phases for the switched-capacitor circuits in the LDC core. There is the LDC core, where the light measurement takes place.

The VCOM output vmid is a fixed value near the mid-range of the voltage swing of the analog circuits. The VCOM output vcomp is controlled by the parameter LdcCompThresh. During the LDC conversion, LdcCompThresh is always 2'b00 (binary value 00), and the vcomp output is equal to vmid. The vcomp output will have other values during offset correction, which is not a subject of this disclosure. The VCOM output vlift is a voltage slightly above ground (nominally 200 mV in this embodiment) that is used during some of the switching phases as described below.

The VDAC outputs vdachi and vdaclo have a voltage difference that is selected by the 5-bit parameter LdcGain. The voltage difference follows a geometric progression described later.

Figure 2:
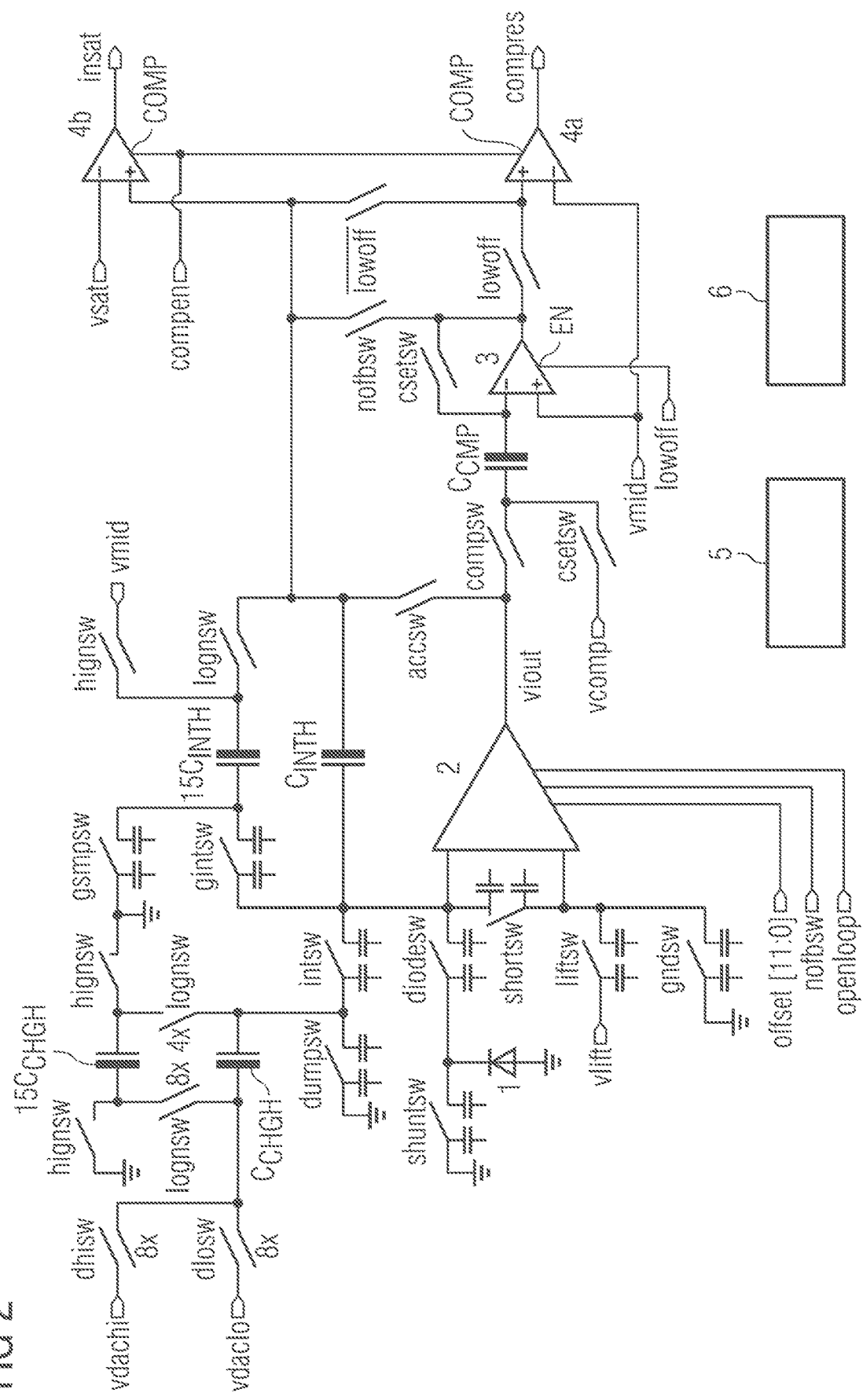
FIG. 2 shows a detailed block diagram of the core analog circuit of FIG. 1.

The core analog circuit of the light to digital converter comprises an integrator, a comparator amplifier, and a latched comparator. A variety of switches configure the operation of the circuits. An overview of the core analog circuit is shown in FIG. 2.

The core analog circuit comprises a photodiode 1, an integrating amplifier 2, a comparator amplifier 3, and two latching comparators 4a and 4b. A variety of switches are configured to control the operation of the circuit. An overview of the core analog is shown in FIG. 2. The switches may be controlled by different clock phases, and the switches may be a simple NMOS switch, a CMOS switch, or an NMOS switch with dummy switches for charge balancing. Internal to the core analog circuit, there is DAC, AZDAC, that is used to correct the DC offset of the integrating amplifier.

The photodiode 1 may be subjected to ambient light to be measured. The photodiode 1 is coupled through a switch to the input of the integration amplifier 2. An integration node 7 is connected to the input of the integration amplifier 2. Depending on the operational phase of the integrator, different circuit elements can be connected to the integration node such as a charge redistribution capacitor, an integration capacitor and the photodiode. The integration capacitor $C_{INTH}$ is connected at least to the input side of the integration amplifier 2. The integration capacitor $C_{INTH}$ may be connected to form a feedback loop to the integration amplifier 2 to form an integrator or may be connected to the output of a comparator amplifier 3 connected downstream the integration amplifier 2 or may be open ended as described herein below. The integration amplifier 2 exhibits an offset that is to be corrected by an offset correction signal offset[11:0] stored in a register 5.

The input side of the comparator amplifier 3 is connected to a comparator capacitor $C_{CMP}$ to which a threshold voltage $V_{COMP}$ can be applied. Another input of the comparator amplifier may be supplied with a reference voltage Vmid.

Two latching comparators 4a, 4b are connected downstream the comparator amplifier 3 to perform a latching of the comparator amplifier output signal. The latching is performed in response to a control signal compen. The latching comparators may be two differentially operated comparators as shown in FIG. 4 or may be realized as one comparator. The function of the latching comparator may be also included in the comparator amplifier 3.

A result register 6 includes a value representative of the amount of light received. The result register is controlled by the latching comparators in response to the comparator amplifier output signal. An initial setting of the result register during a pre-charge phase before the main integration phase achieves a proper starting point. After the main integration phase, a residue phase determines the residual charge in the integration capacitor and updates the result register correspondingly.

The charge redistribution capacitor $C_{CHGH}$ may be connected to the input of the integration amplifier 2. The charge redistribution capacitor may be supplied with high and low reference voltages vdachi and vdaclo that may be generated by digital-to-analog converter circuits. The core analog circuit may be operated in different gain modes such as high gain and low gain modes that use integration capacitors and charge redistribution capacitors of different size such as $C_{CHGH}$, $C_{INT}$ for the high gain mode and both $C_{CHGH}$, $C_{INT}$ and $15C_{CHGH}$, $15C_{INT}$ for the low gain mode. In the low gain mode, both sizes of capacitors are used at the same time.

The DAC settings and switch configurations are all managed by a digital LDC Controller block. This block implements the timing and configuration order for the LDC conversion algorithm. The switch configurations that are used during the conversion algorithm are described below.

Low Gain Initialization Configuration

In the low gain initialization configuration, the following switches are closed: log nsw, gintsw, shuntsw, nofbsw, csetsw, lowoff, dlosw, dumpsw, shortsw, gndsw, and en. All other switches are open. This configuration connects the low gain capacitors, but puts the main amplifier in its no-feedback state. The comparator amplifier is set to sample the comparator voltage and simultaneously drive vmid at its output. This vmid output is used to sample vmid onto the integrating capacitors.

When entering this mode either from the powered-off state or from an auto-zero or previous LDC measurement, the LDC controller allows at least 64 clock periods (86.8 µs) for the voltages to stabilize. Ideally, the settling of all signals levels would be to within 0.05% of their final value in this time, but the LDC results are only moderately sensitive to settling in this mode since it is followed by level setting steps.

Figure 3A:
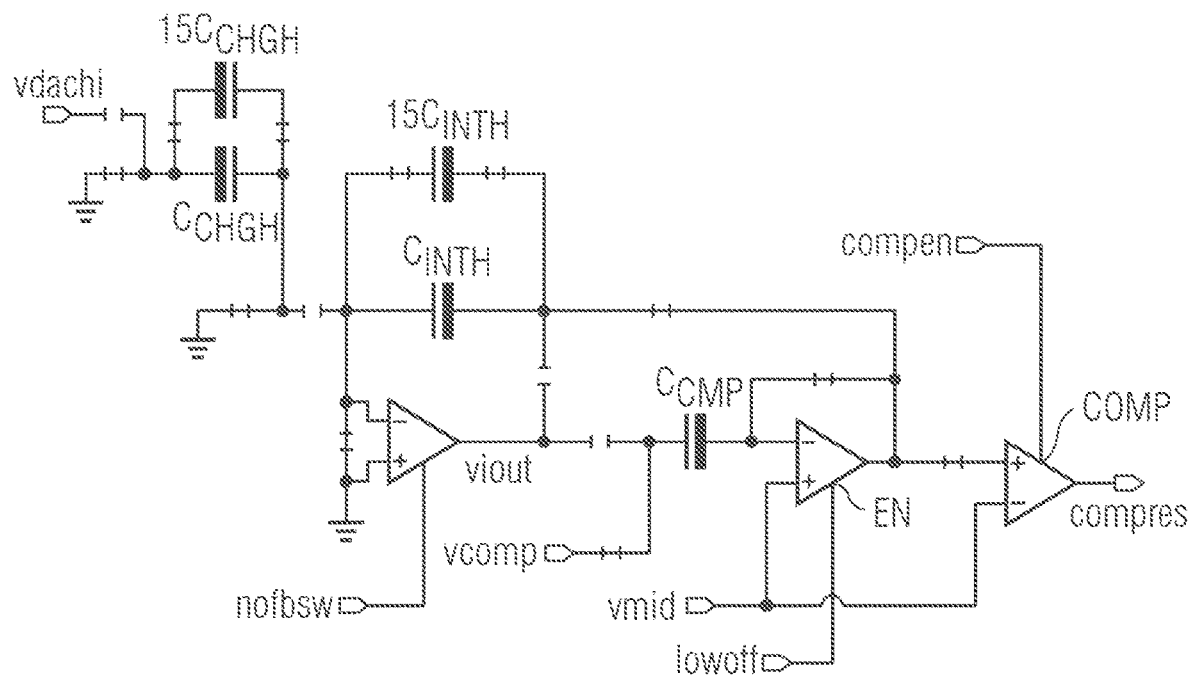
FIGS. 3A through 3J show configurations of the core analog circuit of FIG. 1 used during the pre-charge and residue phases.

An overview of the low gain initialization configuration is shown in FIG. 3A.

Low Gain Idle Configuration

The low gain idle configuration is used in two ways. When it follows the low gain initialization configuration, it is used to take the voltage that was sampled on to the integration capacitor and apply it to the closed loop amplifier. This allows the sampled voltage to establish the initial state of the integrator. In other situations, it is used as a buffer step between other states. In the low gain idle configuration, the following switches are closed: log nsw, gintsw, shuntsw, accsw, csetsw, lowoff, dlosw, dumpsw, gndsw, and en. All other switches are open.

When entering this configuration from the low gain initialization configuration, the feedback loop of the integrator is closed around the voltage that was sampled on the integration capacitance, and the amplifier is placed in its normal gain mode (nofbsw is low). The intsw that was closed in the low gain initialization is opened in order to hold the voltage across the integration capacitors. Three clock periods are allowed for the voltage levels to settle (4.07 µs).

When entering this configuration from other states, the voltage levels around the main amplifier are just being held, so settling should not be a problem, so only one clock period is allocated for this state.

Figure 3B:
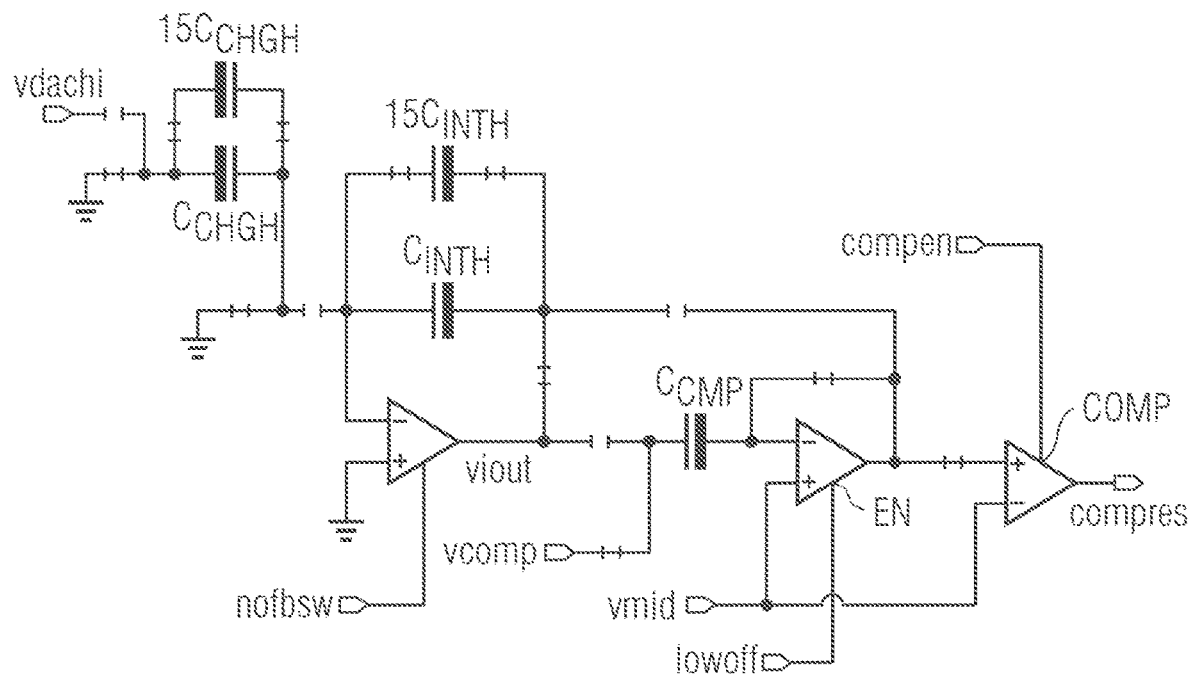

An overview of the low gain idle configuration is shown in FIG. 3B.

Forced Down Charge Configuration

The forced down charge configuration lowers the integrator output voltage by pulling the charge redistribution capacitor input from ground to vdachi while the integrator summing node is connected to the charge redistribution capacitor. The following switches are closed: log nsw, gintsw, shuntsw, accsw, csetsw, lowoff, dhisw, intsw, gndsw, and en. All other switches are open.

This configuration is always entered from the low gain idle configuration. The main concern is to get complete charge redistribution during the time that the redistribution capacitor is connected. This is a function of both the speed of the integration amplifier and the RC time constant of the DAC output with the redistribution capacitor. In order to have errors totaling less than 0.05%, the charge transfer must be at least 99.95% complete during the residue down charge time, which is two clock periods (2.71 µs). If there is single pole settling, the 99.95% settling requirement would be equivalent to requiring 7.6 time constants of settling, which is a time constant of 357 ns. It is to be noted that this settling must be measured by the voltage across the redistribution capacitors, $C_{CHGH}$ and $15C_{CHGH}$. Measuring at just the one or the other plates of that capacitor relative to ground may give overly optimistic settling results. It is also to be noted that this settling must be measured for all DAC values, because the effective output impendence of the DAC varies with its output value.

Figure 3C:
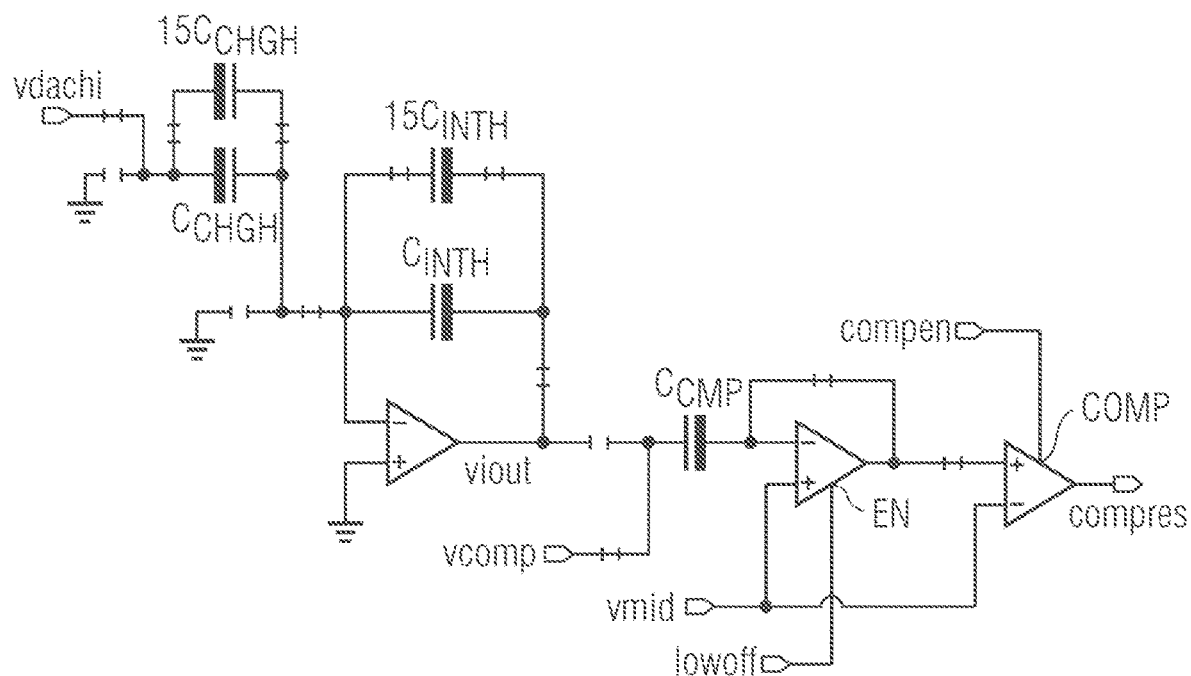

An overview of the forced down charge configuration is shown in FIG. 3C.

Residue Amplify Configuration

The residue amplify state begins the process of comparing the integrator output, viout, to the comparator voltage, vcomp, by putting the comparator amplifier into its amplification mode. The following switches are closed: log nsw, gintsw, shuntsw, accsw, compsw, lowoff, dlosw, dumpsw, gndsw, and en. All other switches are open.

The residue amplify configuration always follows the low gain idle configuration. No charge is transferred at the integrating summing node, so the integrator output should remain fixed. There will be a small amount of settling as the comparator input capacitor is connected, but this effect is small because the comparator input capacitor is only in series with the comparator amplifier input capacitance. The primary design constraint is that the amplifier output must swing enough in one clock period (1.36 μs) such that the latching comparator can resolve the correct answer. There is a tradeoff between the amplifier design and the latching comparator design. The smallest voltage difference that must be resolved is ½ of one LSB of the residue computation, as measured at the output of the integrator. This is 0.5 mV. Therefore, if viout is at least 0.5 mV above or below vcomp, the combination of the residue amplify configuration followed by the residue compare configuration described below must be able to produce the correct comparison result. This must include the effect of any offset in the latching comparator.

Figure 3D:
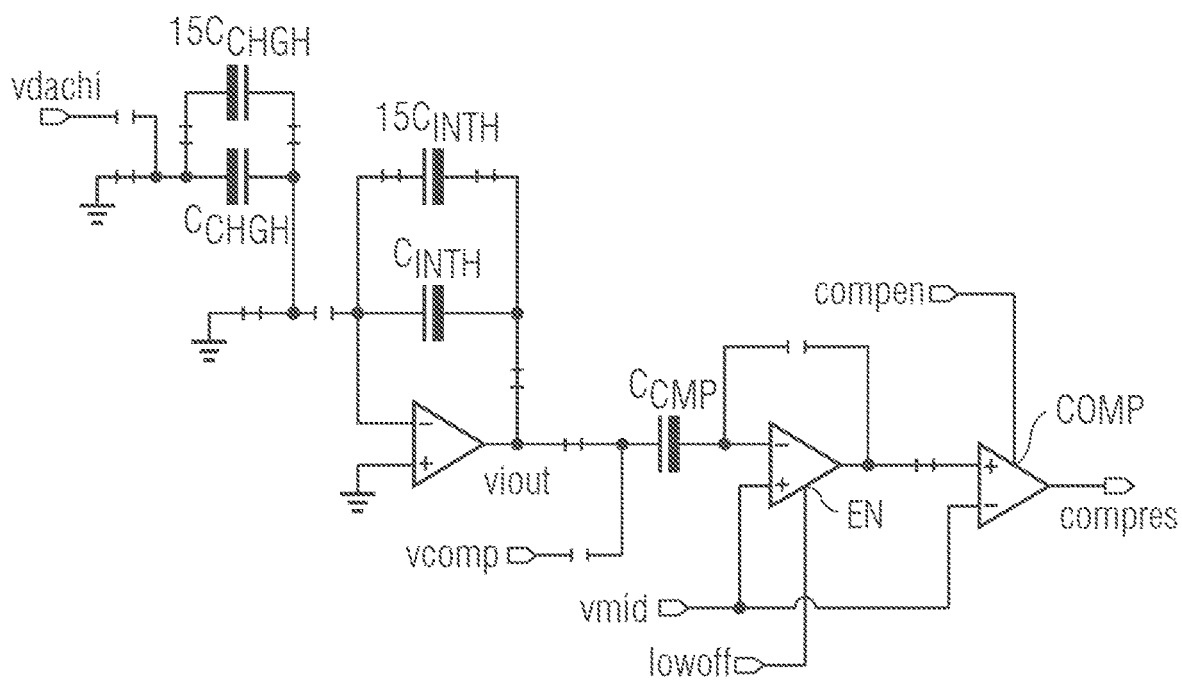

An overview of the residue amplify configuration is shown in FIG. 3D.

Residue Compare Configuration

The residue compare configuration completes the comparison of the integrator output, viout, to the comparator voltage, vcomp, by enabling the comparator latch. The following switches are closed: log nsw, gintsw, shuntsw, accsw, compsw, lowoff, dlosw, dumpsw, gndsw, compare, and en. All other switches are open.

The residue compare configuration always follows the residue amplify configuration. As described in the residue amplify configuration, the combination of the residue amplify and residue compare configurations must be able to resolve a 0.5 mV difference at viout.

Figure 3E:
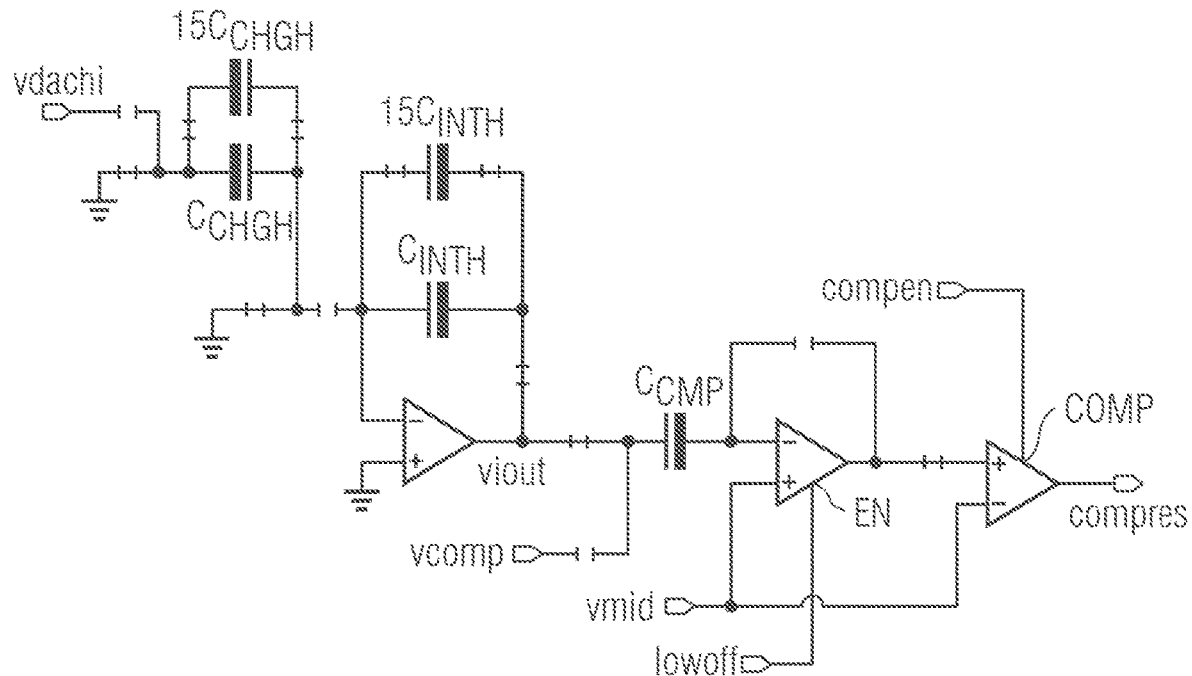

An overview of the residue compare configuration is shown in FIG. 3E.

Residue Down Charge Configuration

The residue down charge configuration is used when the comparison result indicated that viout was too high. The residue down charge configuration is nearly identical to the forced down charge configuration, except that the vcomp voltage is not connected to the comparator input capacitor. This configuration is used during the residue processes following a comparison. At the end of the comparison, the integrator output is tied to the comparator input capacitor. Rather than immediately reconnecting this capacitor to vcomp, it is left floating for a few clock cycles so that currents on vcomp do not disturb the vdachi voltage that is being used for charge redistribution. The following switches are closed: log nsw, gintsw, shuntsw, accsw, lowoff, dhisw, intsw, gndsw, and en. All other switches are open. The closed switch dhisw connects the charge redistribution capacitors to the vdachi voltage potential. The closed switch intsw connects the charge redistribution capacitors to the input of the integrator. The reference node of the integrator is connected to ground potential through closed switch gndsw.

Figure 3F:
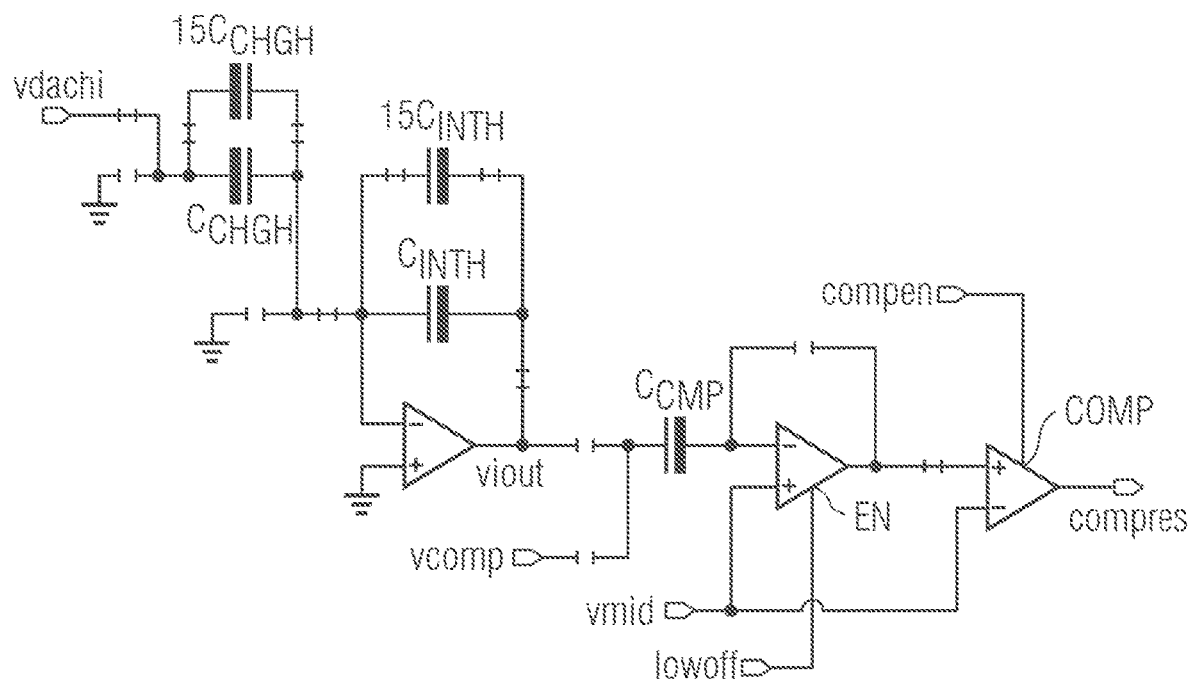

The residue down charge configuration always follows the residue compare configuration. The timing constraints for the residue down charge are identical to those for the forced down charge configuration. An overview of the residue down charge configuration is shown in FIG. 3F.

Residue Down Idle Configuration

The residue down idle configuration is used when the comparison result indicated that viout was too high. The residue down idle configuration follows the residue down charge configuration, and is essentially an idle configuration that happens during the time when an up charge would occur if the comparator result had been different. It is identical to the low gain idle configuration, except that the comparator input capacitor is left floating. In the residue down idle configuration, the following switches are closed: log nsw, gintsw, shuntsw, accsw, lowoff, dumpsw, gndsw, and en. All other switches are open.

Since there are no significant voltage changes, settling should not be an issue. The only concern is that the integrator remain stable with the comparator input capacitor removed.

Figure 3G:
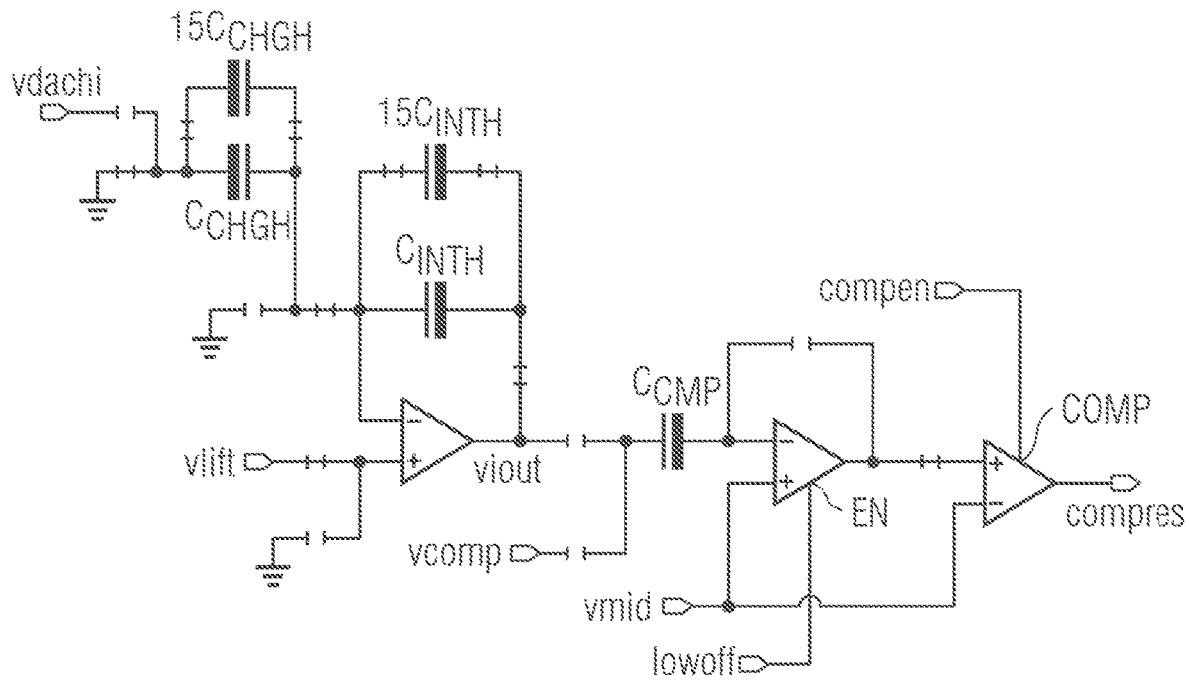

An overview of the residue down idle configuration is shown in FIG. 3G.

Residue Lift Prepare Configuration

The residue lift prepare configuration is used when the comparison result indicated that viout was too low. The residue lift prepare configuration is the first of a three step process to raise the integrator output voltage through charge redistribution. In principle, the output voltage could be raised through a reverse of the residue down charge method, that is, pulling the charge redistribution capacitor from vdachi to ground while the integrator summing node is connected to the charge redistribution capacitor. The problem with this approach is that during the settling process, the summing node could be pulled below the bulk voltage, and cause charge loss through the bulk diode. To avoid this problem, three configurations are used in sequence, beginning with the residue lift prepare.

In the residue lift prepare configuration, the reference node of the integrator is changed from ground to vlift. The following switches are closed: log nsw, gintsw, shuntsw, accsw, lowoff, dhisw, dumpsw, liftsw, and en. All other switches are open. As with the residue down charge configuration, the comparator input capacitor is left floating for a few clock cycles so that currents on vcomp do not disturb the vdachi voltage.

This configuration is always entered from the residue compare configuration. Settling should be fairly rapid since only the parasitic capacitances have voltages that change. Furthermore, since this configuration happens during the same time frame as the residue down charge, so there are two clock periods (2.71 μs) for settling.

Figure 3H:
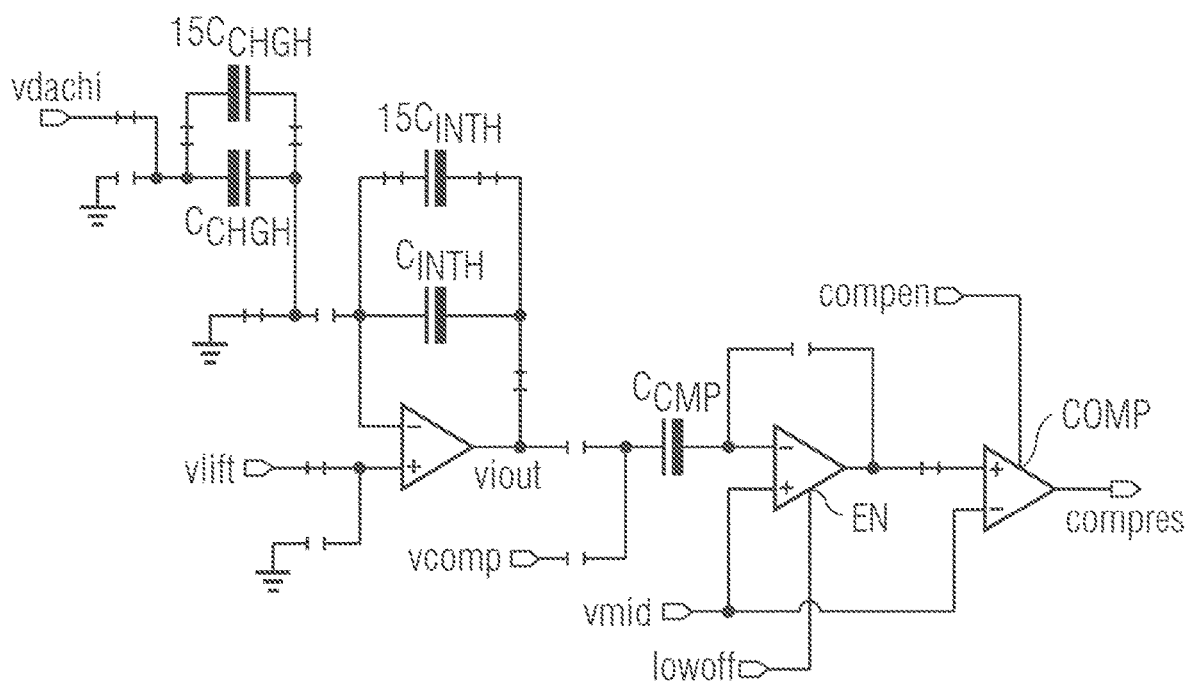

An overview of the residue lift prepare configuration is shown in FIG. 3H.

Residue Lift Charge Configuration

The residue lift charge configuration is used when the comparison result indicated that viout was too low. The residue lift charge configuration is the second of the three step process to raise the integrator output voltage. The charge redistribution capacitor is pulled from vdachi to ground while the integrator summing node is also connected to the charge redistribution capacitor. The following switches are closed: log nsw, gintsw, shuntsw, accsw, lowoff, dlosw, intsw, liftsw, and en. All other switches are open. The closed switch dlosw connects the charge redistribution capacitors to ground potential. The closed switch intsw connects the charge redistribution capacitors to the input of the integrator. The reference node of the integrator is connected to the lift potential vlift through closed switch liftsw.

This configuration is always entered from the residue lift prepare configuration. This configuration lasts for one clock cycle, and the charge transfer does not need to complete. The only objective is to have enough charge transfer completed such that when the configuration switches to the residue up charge configuration described next, the voltage at the summing node does not go below ground enough to cause charge loss.

Figure 3I:
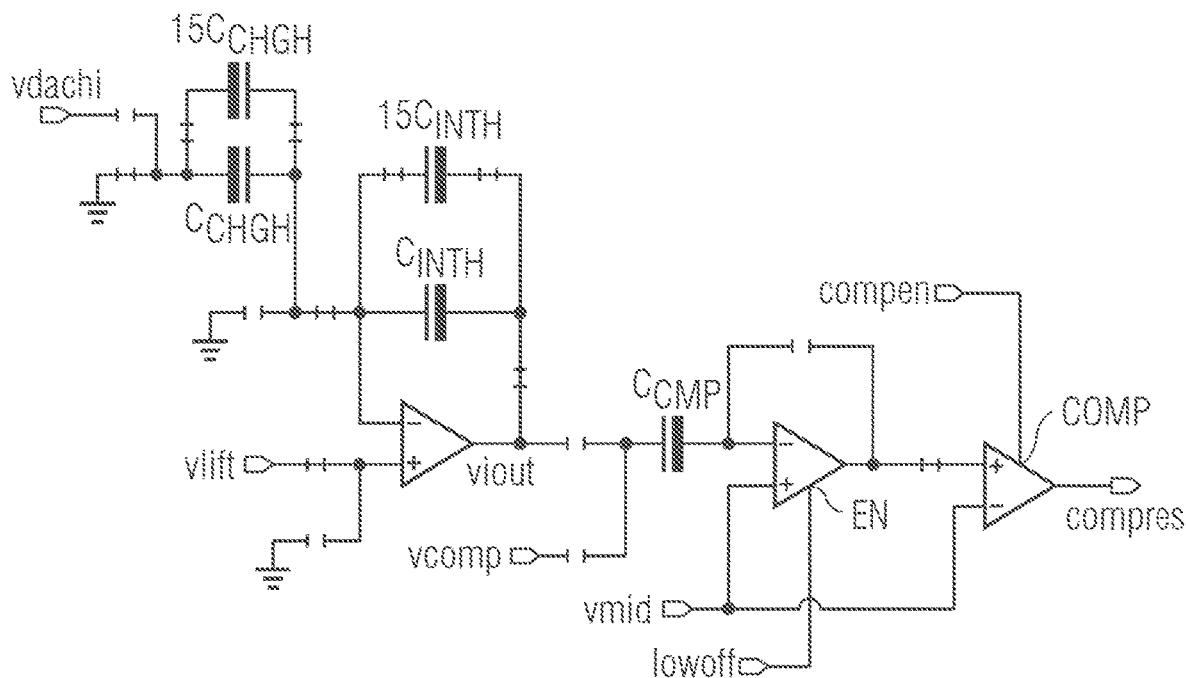

An overview of the residue lift charge configuration is shown in FIG. 3I.

Residue Up Charge Configuration

The residue up charge configuration is used when the comparison result indicated that viout was too low. The residue up charge configuration is the final step in the three step process to raise the integrator output voltage. The integrator reference node is returned to ground to allow the charge transfer process to complete. The following switches are closed: log nsw, gintsw, shuntsw, accsw, lowoff, dlosw, intsw, gndsw, and en. All other switches are open. The closed switch dlosw connects the charge redistribution capacitors to ground potential. The closed switch intsw connects the charge redistribution capacitors to the input of the integrator. The reference node of the integrator is connected to ground potential through closed switch gndsw.

This configuration is always entered from the residue lift charge configuration, and lasts for two clock cycles (2.71 µs). As with the forced down charge and residue down charge configurations, the objective is to have the charge transfer from the charge redistribution capacitor at least 99.95% complete. This settling must be measured by the voltage across the redistribution capacitors, $C_{CHGH}$ and $15C_{CHGH}$, and if must be measured for all DAC values, because the effective output impendence of the DAC varies with its output value.

Figure 3J:
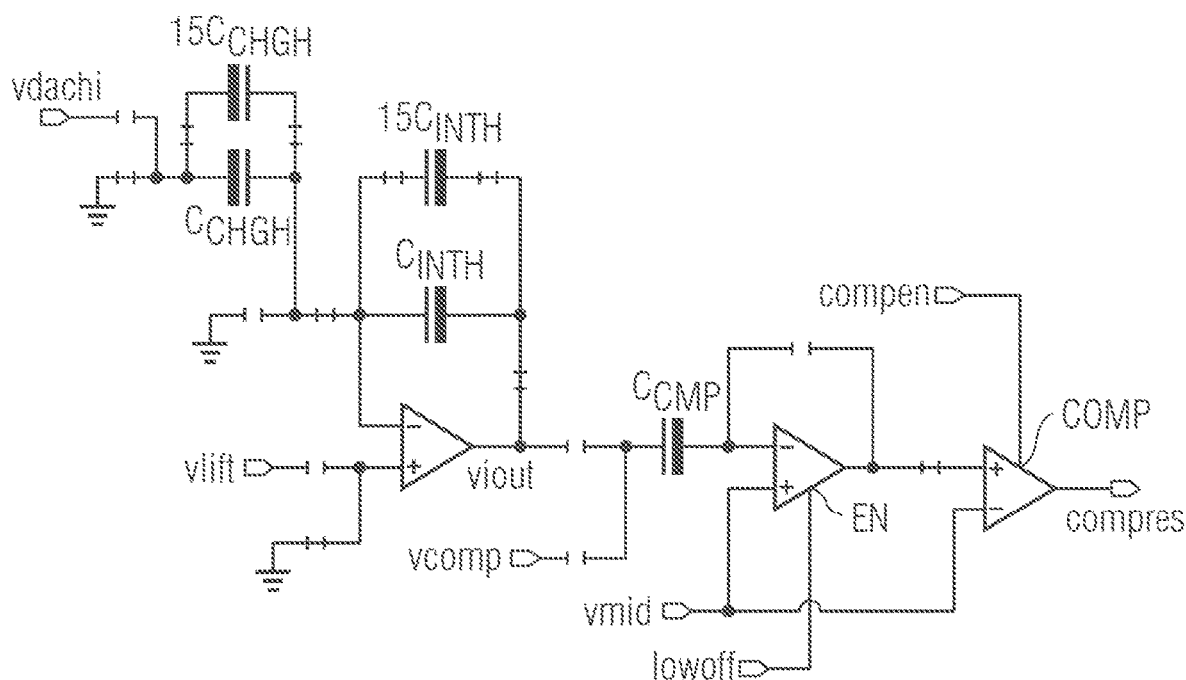

An overview of the residue up charge configuration is shown in FIG. 3J.

Diode Idle Configuration

The diode idle configuration is the step prior to the main integration interval and the step after the main integration interval. The capacitors are switched to the gain setting that will be used during diode current integration. The vdachi voltage is set to the value that will be used during the integration. The comparator amplifier is disabled and bypassed to save current. The following switches are closed: shuntsw, accsw, csetsw, dlosw, dumpsw, gndsw, and en. If low gain mode is being used, the log nsw and gintsw switches are closed. Otherwise, the hignsw and gsmpsw switches are closed.

During this configuration, no charge transfer is occurring, so there are no significant settling concerns. The main design constraint is that the main amplifier remain stable with the new loading configuration when operating in the high gain mode. When in low gain mode, there is no change from the residue configurations.

Figure 4A:
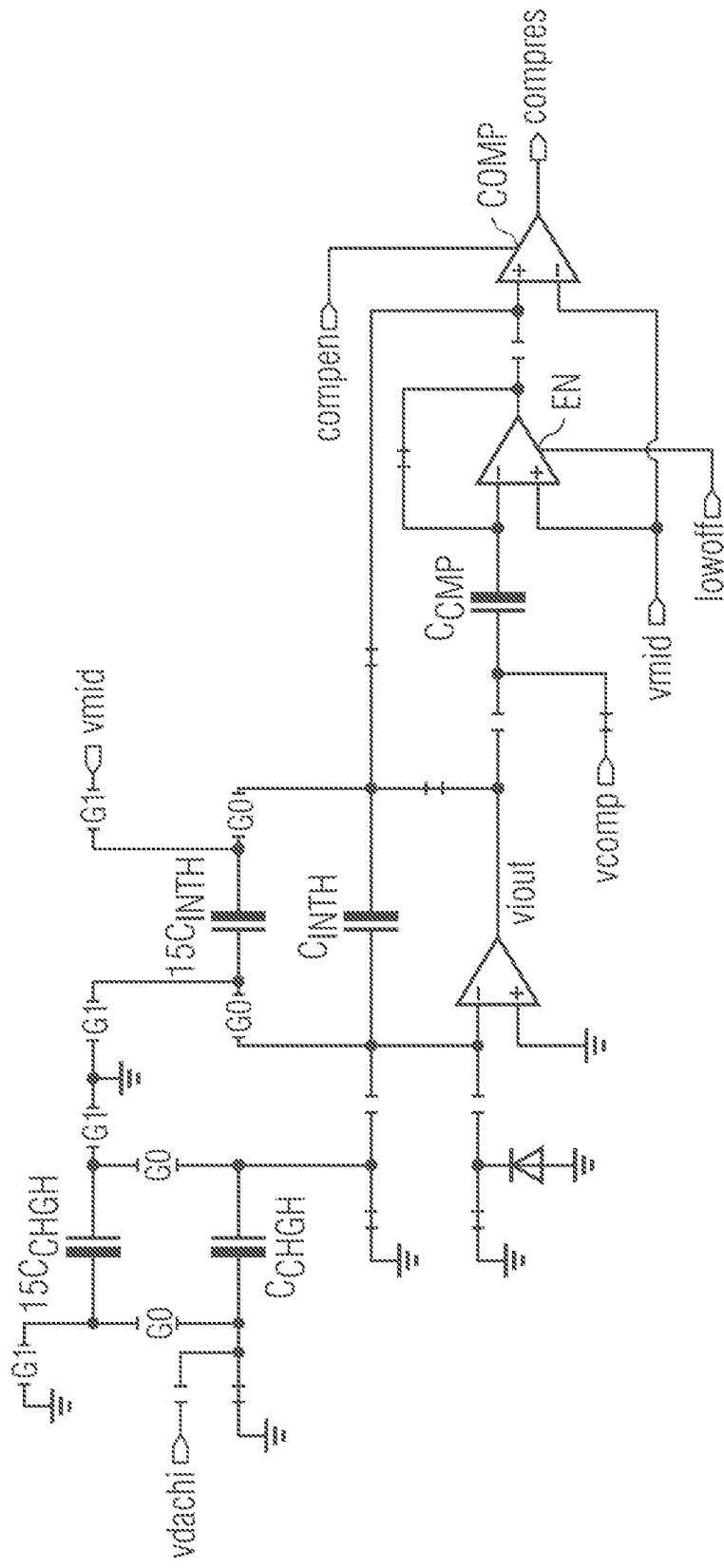
FIGS. 4A through 4C show configurations of the core analog circuit of FIG. 1 used during the main integration phase.

An overview of the diode idle configuration is shown in FIG. 4A.

Diode Compare Configuration

The diode compare configuration initiates a comparison of the integrator output, viout, to the midpoint voltage, vmid. If this is the start of the main integration, this is when the diode is first connected to the integrator summing node. The following switches are closed: diodesw, accsw, csetsw, dlosw, dumpsw, gndsw, and en. If low gain mode is being used, the log nsw and gintsw switches are closed. Otherwise, the hignsw and gsmpsw switches are closed.

When it is first used, the diode compare configuration is entered from the diode idle configuration. Otherwise, it is part of the main integration loop with the diode down charge configuration. There are two main considerations in this configuration: integrator stability and comparator speed.

The integrator stability must take into account the sizable parasitic capacitance of the diode. This greatly changes the dynamic performance compared with the residue configurations, and it is expected that the compensation circuitry of the main amplifier will have to be adjusted for this configuration.

The comparator, being a simple latching comparator, is not expected to have great accuracy. The system is reasonably insensitive to noise or offset in the comparator, because an "incorrect" comparison will be self-corrected during the next loop. The important factor is for the comparator not to ever be in a no-decision state at the end of one half of a clock period. The comparator decision is started on the falling edge of the main controller clock and captured on the rising edge.

Figure 4B:
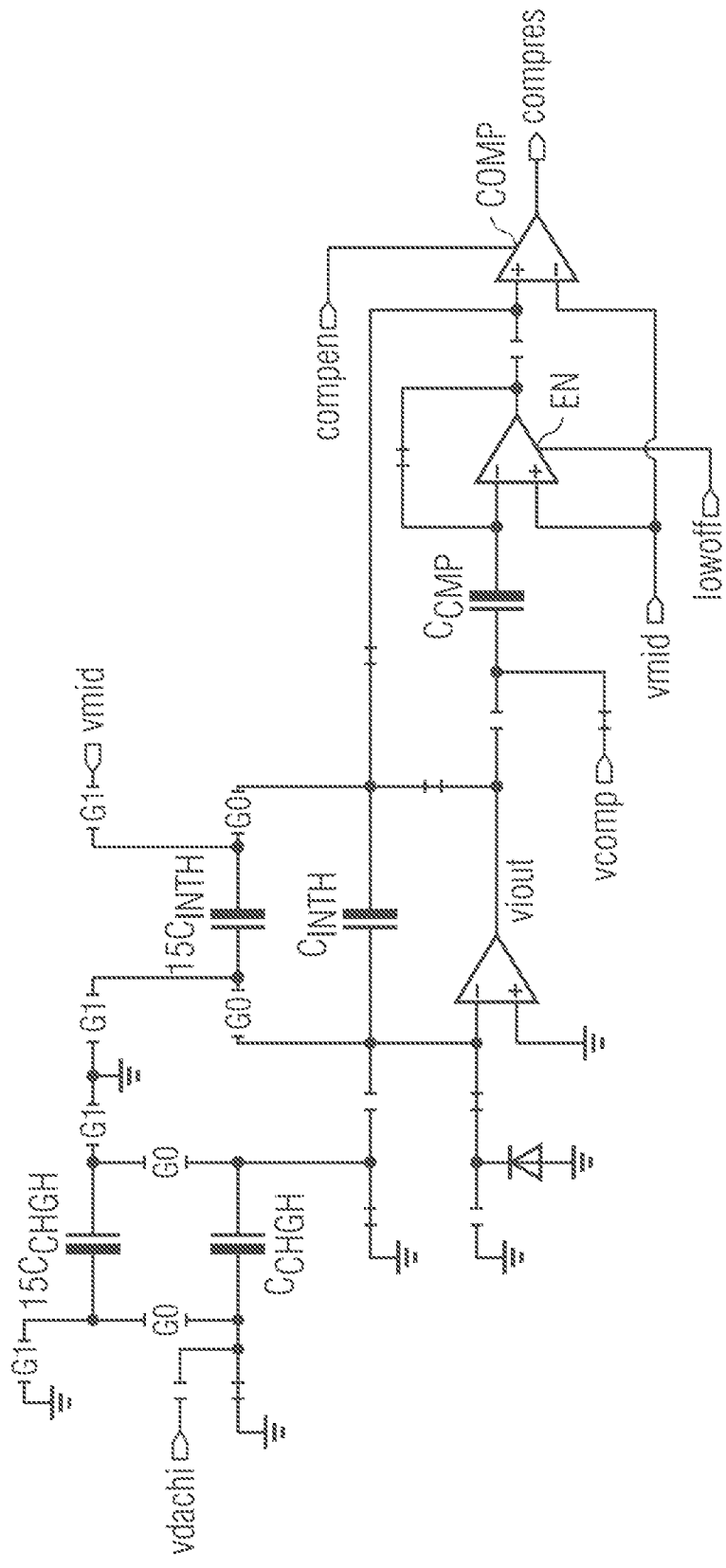

An overview of the diode compare configuration is shown in FIG. 4B.

Diode Down Charge Configuration

The diode down charge configuration redistributes a charge to lower the integrator output, viout, if the comparison result indicated that viout was greater than the midpoint voltage, vmid. If a charge redistribution is needed, the charge redistribution capacitor input is pulled from ground to vdachi while the integrator summing node is connected to the charge redistribution capacitor. The following switches are closed: diodesw, accsw, csetsw, gndsw, and en. If a charge redistribution is needed, the dhisw and intsw switches are closed. If a charge redistribution is not needed, the dlosw and dumpsw switches are closed. If low gain mode is being used, the log nsw and gintsw switches are closed. Otherwise, the hignsw and gsmpsw switches are closed.

This configuration is always entered from the diode compare configuration. Like the forced down charge and residue down charge configurations, the main concern is to get complete charge redistribution during the time that the capacitor is connected. The challenge is that the capacitive load of the diode presents a much different dynamic response than in the residue configurations. Furthermore, there is only one clock period (1.36 µs) for the settling to complete. As measured by the voltage across the redistribution capacitors, $C_{CHGH}$ and $15C_{CHGH}$, settling must be within 99.95% of its final value within one clock period. This settling must be measured for the five DAC values that are used for the different LDC gain settings. The worst case is the DAC setting for the 4× gain setting, which is LdcGain=14. In order to achieve 99.95% settling, the time constant with the DAC output impedance and the charge capacitor must be 7.6 times the clock period. This leads to a maximum DAC unit resistance of 24 kΩ, which in turn leads to a minimum DAC string current of 1.7 µA.

Figure 4C:
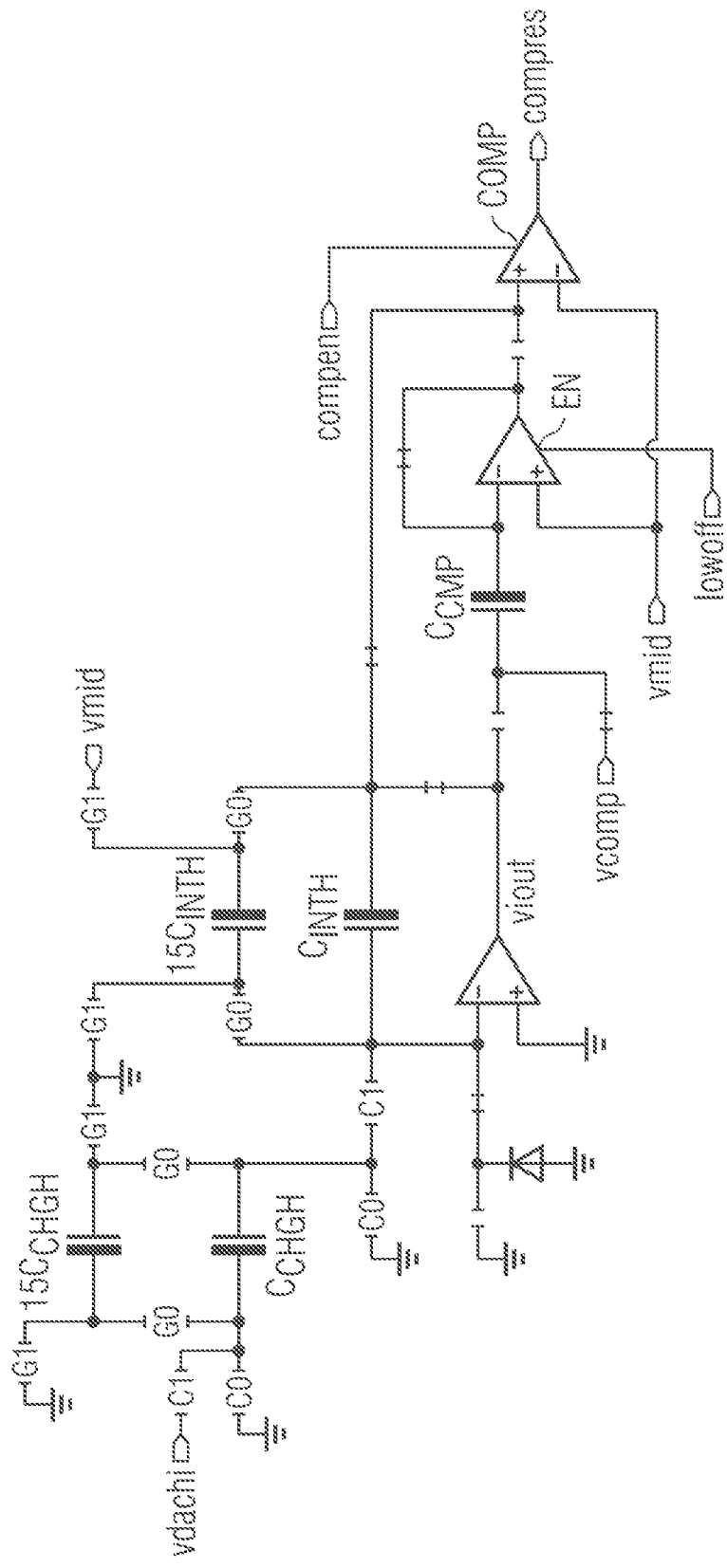

An overview of the diode down charge configuration is shown in FIG. 4C.

Residue Sampling Configuration

The residue sampling configuration is used as an intermediate step to allow the residue algorithm to use the larger low-gain capacitors even when the main integration was in high-gain mode. The summing node connection of the integration capacitors is left as it was during the main integration. The output node of both integration capacitors is forced to be connected to the amplifier output. If the main integration was using low gain mode, this is no change. If the main integration was using high gain mode, this will cause the integrator output to be sampled on to the larger low-gain integration capacitor.

In the residue sampling configuration, the comparator amplifier is also enabled in preparation for the residue algorithm, and the DAC output vdachi is preset to the first value needed by the residue algorithm.

The residue sampling configuration is always entered from the diode idle configuration. If there is a switch from high gain to low gain, the integrator output must settle to within ½ LSB of its final value within one clock period. In an embodiment, it must settle to within 0.5 mV of its final value within 1.36 µs.

An overview of the residue sampling configuration is shown in FIG. 5.

Conversion Algorithm Overview

The light to digital conversion algorithm (LDC) uses a digital state machine to sequence the analog configurations described above in order to compute the current that is generated by light incident on the photodiode 1 shown in FIG. 2. This algorithm can be broken into three main phases: pre-charge phase, integration phase, and residue phase.

The pre-charge phase places the integrator output at a known starting point to allow accurate computation of the residue. In it, the following steps are performed:
1. Set the integrator output to approximately vmid.
2. Apply down charge to lower integrator output by ¼ "count".
3. Use residue ½ bit per step search algorithm to return the integrator output to vmid.
4. Apply down charge to lower integrator output by ½ "count" and set result register to +0.5 counts as a starting point.

The integration phase is where the photodiode current is actually sampled on to the integrator. It is by far the longest phase in terms of time. In it, the following steps are performed:
1. Connect the photodiode to the integrator summing node.
2. Check if integrator voltage is above vmid.
3. If so, apply down charge to lower integrator by 1 "count" and increment result register by 1 "count". Repeat steps 2 and 3 for the desired integration time.
4. Disconnect the photodiode.

The residue phase is used to compute the charge remaining on the integrator. In it, the following steps are performed:
1. Use residue ½ bit per step search algorithm to return the integrator output to vmid.
2. During the search algorithm, update the result register by an amount proportional to the charge applied.

The details of one embodiment of how these phases are implemented is described below. First, the digital control and state machines for this converter are described. Second, the switch control circuits are described. Finally, the analog circuit operation is described.

Pre-Charge Phase

Figure 6:
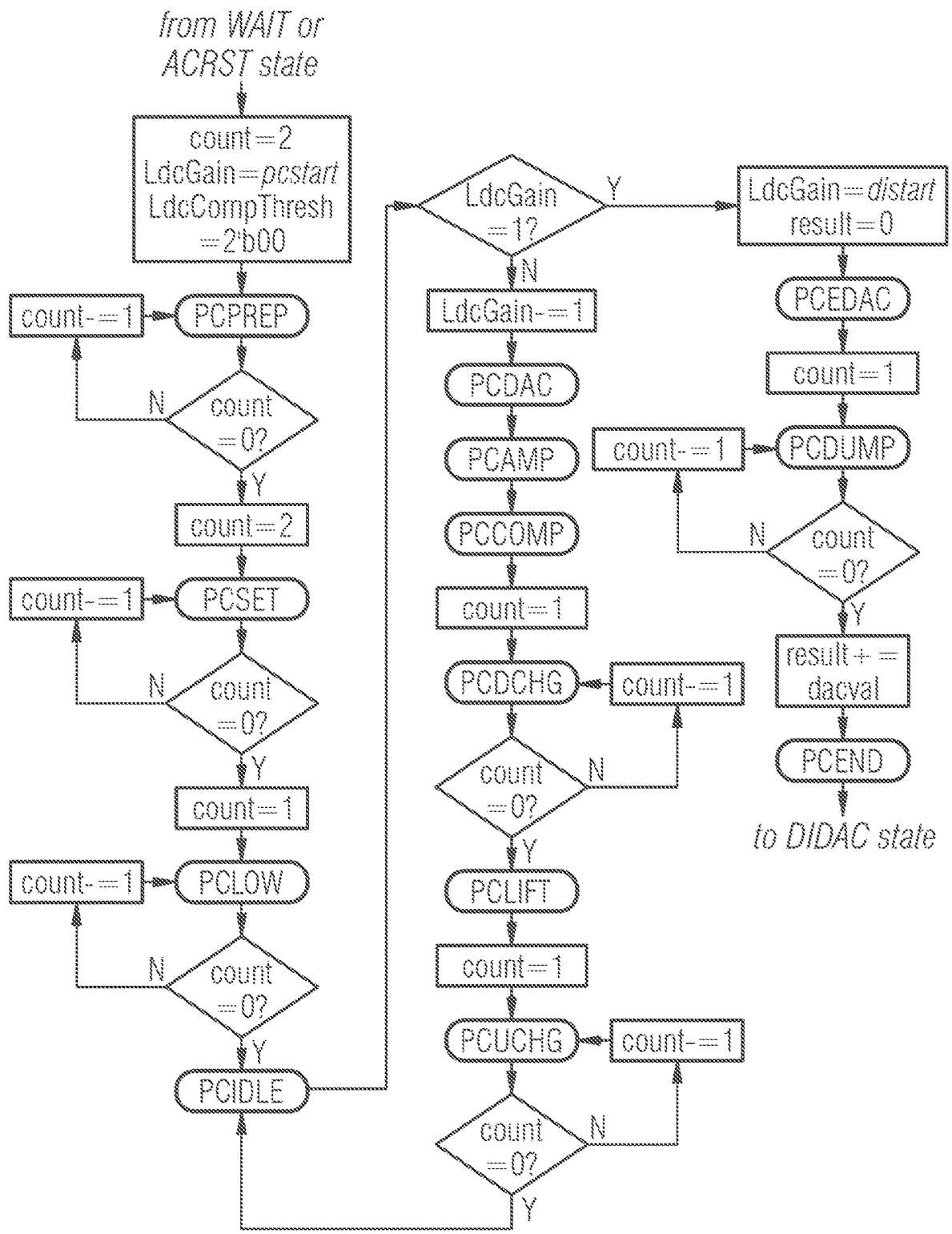
FIG. 6 shows a state machine diagram to sequence the configurations during the pre-charge phase.

The pre-charge states are the first phase of a three-phase process to measure the diode current. The purpose of the pre-charge phase is to set up the integrator output with a known starting point so that an accurate residue can be computed at the end. At the end of the pre-charge phase the result register is set to a starting value. The state diagram for the pre-charge states is shown in FIG. 6.

The pre-charge phase is entered after the last warmup state (WARM) or the last autozero algorithm state (AZRST) is completed. The cycle counter is set to 2, the LdcGain index is set to the parameter pcstart, and the comparator voltage vcomp is set to vmid (by setting LdcCompThresh to 0). The pcstart parameter depends on the gain setting cnvgain; a table is given towards the end of this section that lists the pcstart parameters. The LdcGain index controls the voltage difference between vdachi and vdaclo. This voltage difference is listed at the DAC voltage in Table 5. The controller enters the PCPREP state, where it stays for three clocks. In the PCPREP state, the circuit is placed in the low gain initialization configuration. In this state the vmid voltage is sampled on to both the high and low gain integration capacitors.

After the three clocks of PCPREP are complete, the cycle counter is set back to 2 and the controller goes to the PCSET state, where it stays for three clocks. In the PCSET state, the circuit is placed in the low gain idle configuration, and the vmid voltage that was sampled on the integration capacitors is used to bias the main amplifier such that its output is approximately vmid. This completes step 1 of the pre-charge phase as described above—set the integrator output to approximately vmid. After the three clocks of PCSET are complete, the cycle counter is then set to 1 and the LDC controller goes to the PCLOW state.

The PCLOW state lasts for two clocks. In this state, the circuit is placed in the forced down charge configuration. The charge redistribution capacitors are connected to the integrating summing node, and the input to the charge redistribution capacitors is raised to the vdachi value set by the LdcGain value pcstart. This redistributes a charge that lowers the integrator output voltage. This is done so that the pre-charge residue process always starts with an integrator output below vmid. This completes step 2 of the pre-charge phase as described above—applying a down charge to lower the integrator output by ¼ "count".

After the PCLOW state, the LDC controller reaches the starting point of the pre-charge residue loop, the PCIDLE state. In the PCIDLE state, the circuit is placed back in the low gain idle configuration. The charge redistribution capacitors are removed from the summing node and discharged. The loop counter for the residue loop is actually the value of the DAC index LdcGain. If the loop is not at the end (which is when LdcGain is 1), the DAC index is decremented, and the residue loop goes to the PCDAC state.

In the PCDAC state, the circuit remains in the low gain idle configuration. The DAC output vdachi is given one clock to settle before the residue comparison begins. The change in the vdachi value could disturb the vcomp value that is being sampled on to the comparator input capacitor, so this state gives one clock for all of this settling to occur. The controller then goes to the PCAMP state for one clock, where the circuit is placed in the residue amplify configuration, the comparator input capacitor is connected to the integrator output, and the difference between the integrator output and vmid (which is the voltage that was set at vcomp) is amplified. This is followed by the PCCOMP state, also one clock, where the circuit is placed in the residue compare configuration and a comparison decision is made.

After the PCCOMP state, the PCDCHG, PCLIFT, and PCUCHG states are run in sequence. The PCDCHG and PCUCHG states last for two clock periods and the PCLIFT state lasts for one clock period. The behavior of these states depends on the comparator result.

If the integrator output was above vmid, the circuit is placed in the residue down charge configuration, the charge redistribution capacitors are connected to the summing node, and the input to the charge redistribution capacitors is raised to the vdachi value set by the current value of LdcGain. This redistributes a charge that lowers the integrator output voltage. The controller then goes to the PCLIFT and PCUCHG states which act as idle states, where the circuit is placed in the residue down idle configuration and the charge redistribution capacitor is removed from the summing node and discharged.

If the integrator output was below vmid, the integrator output voltage is raised. To accomplish this without leaking charge through the summing node switches, the reference node of the integrator is raised to vlift during the PCDCHG and PCLIFT states. In the PCDCHG state, the circuit is placed in the residue lift prepare configuration and the vdachi voltage is sampled on to the charge redistribution capacitors. That is followed by the PCLIFT state, where the circuit is placed in the residue lift charge configuration and the charge redistribution capacitors are connected to the summing node and the input of the charge redistribution capacitors are discharged to ground. As a last step, the controller goes to the PCUCHG state, where the circuit is placed in the residue up charge configuration, the reference node is returned to ground, and the charge redistribution to raise the integrator output voltage is completed.

After the PCUCHG state completes, the LDC controller returns to the PCIDLE state to allow the charge redistribution to complete before changing the DAC value. If the residue loop is not complete, the LdcGain is decremented and the loop continues with the PCDAC state described above.

The residue loop employs a successive approximation algorithm. When the residue loop is completed, the integrator output voltage will be at approximately vmid. By returning to this same voltage during the residue phase, any offset in the comparator is cancelled. This completes step 3 of the pre-charge phase as described above—use the residue ½ bit per step search algorithm to return the integrator output to vmid.

Once the residue loop is complete, the LdcGain index is set to distart and the internal LDC result register is set to 0. The LDC controller goes from the PCIDLE state to the PCEDAC state, where the circuit remains in the low gain idle configuration and the new DAC value is given one clock to settle. Also in the PCEDAC state, the low-offset comparator is switched off to prevent a voltage glitch when switching comparator modes.

Next is the PCDUMP state, which lasts for two clocks. Much like the PCLOW state, the circuit is placed in the forced down charge configuration, the charge redistribution capacitors are connected to the integrating summing node, and the input to the charge redistribution capacitors is raised to the vdachi value set by the LdcGain value distart. This redistributes a charge that lowers the integrator output voltage by one-half of the full scale value used during diode integration. The result register is incremented by the DAC value that corresponds to distart. This value can be found in Table 1 below. The voltage lowering is done so that the integrator will not saturate in strong light when the diode is first connected. The half of full scale value is used to enable the LDC to measure slight negative currents in the case of no light and a slight negative offset in the main amplifier. This completes step 4 of the pre-charge phase as described above—apply down charge to lower the integrator output by ½ "count" and set the result register to +0.5 counts as a starting value that forms a starting point for the diode integration phase.

After the PCDUMP state, the controller goes to the PCEND state for one clock. The circuit is placed in the low gain idle configuraiton in order to disconnect and discharge the charge redistribution capacitors and prepare for the main diode integration. The next state will be the DIDAC state described in the Diode Integration section below.

Adding the time of the various pre-charge states, the total number of clocks used by the pre-charge states is (9 pcstart+ 4), where pcstart determines the number of loops in the residue algorithm. The parameter pcstart in turn depends on the gain setting cnvgain. Table 1 below lists the various parameters that are derived from cnvgain, including the higain capacitor type and dint parameters that are used in the diode integration part of the state machine. The table also includes the number of clocks used in the residue computation states that are described later.

TABLE 1

| cnvgain | Gain | higain | dint | pcstart | distart | PC Clocks | RS Clocks |
|---|---|---|---|---|---|---|---|
| 0 | 1× | 0 | 18 | 14 | 16 | 130 | 157 |
| 1 | 2× | 0 | 16 | 12 | 14 | 112 | 139 |
| 2 | 4× | 0 | 14 | 10 | 12 | 94 | 121 |
| 3 | 8× | 0 | 12 | 8 | 10 | 76 | 103 |
| 4 | 16× | 1 | 18 | 14 | 16 | 130 | 157 |
| 5 | 32× | 1 | 16 | 12 | 14 | 112 | 139 |
| 6 | 64× | 1 | 14 | 10 | 12 | 94 | 121 |
| 7 | 128× | 1 | 12 | 8 | 10 | 76 | 103 |
| 8 | 256× | 1 | 10 | 6 | 8 | 58 | 85 |
| 9 | 512× | 1 | 8 | 4 | 6 | 40 | 67 |

The switch control signals for the states in the pre-charge group are summarized in Table 2 below.

TABLE 2

| State | cnvdone | LdcFunction | LdcCapGain | LdcCapSample | LdcDiodeEn | LdcInitZ | LdcAccumulate |
|---|---|---|---|---|---|---|---|
| PCPREP | 0 | 1 | R | R | 0 | 0 | 0 |
| PCSET | 0 | 1 | R | R | 0 | 1 | 1 |
| PCLOW | 0 | 1 | R | R | 0 | 1 | 1 |
| PCIDLE | 0 | 1 | R | R | 0 | 1 | 1 |
| PCDAC | 0 | 1 | R | R | 0 | 1 | 1 |
| PCAMP | 0 | 1 | R | R | 0 | 1 | 1 |
| PCCOMP | 0 | 1 | R | R | 0 | 1 | 1 |
| PCDCHG | 0 | 1 | R | R | 0 | 1 | 1 |
| PCLIFT | 0 | 1 | R | R | 0 | 1 | 1 |
| PCUCHG | 0 | 1 | R | R | 0 | 1 | 1 |
| PCEDAC | 0 | 1 | R | R | 0 | 1 | 1 |
| PCDUMP | 0 | 1 | R | R | 0 | 1 | 1 |

TABLE 2-continued

| PCEND | 0 | 1 | R | R | 0 | 1 | 1 |
|---|---|---|---|---|---|---|---|
| State | LdcCompAmplify | LdcCompPoll | LdcDownCharge | LdcUpCharge | LdcForceCharge | LdcLift | LdcCompHighRes |
| PCPREP | 0 | 0 | 0 | 0 | 0 | 0 | 1 |
| PCSET | 0 | 0 | 0 | 0 | 0 | 0 | 1 |
| PCLOW | 0 | 0 | 1 | 1 | 1 | 0 | 1 |
| PCIDLE | 0 | 0 | 0 | 0 | 0 | 0 | 1 |
| PCDAC | 0 | 0 | 0 | 0 | 0 | 0 | 1 |
| PCAMP | 1 | 0 | 0 | 0 | 0 | 0 | 1 |
| PCCOMP | 1 | 1 | 0 | 0 | 0 | 0 | 1 |
| PCDCHG | 1 | 0 | 1 | 0 | 1 | 1 | 1 |
| PCLIFT | 1 | 0 | 0 | 1 | 0 | 1 | 1 |
| PCUCHG | 1 | 0 | 0 | 1 | 0 | 0 | 1 |
| PCEDAC | 0 | 0 | 0 | 0 | 0 | 0 | 0 |
| PCDUMP | 0 | 0 | 1 | 1 | 1 | 0 | 0 |
| PCEND | 0 | 0 | 0 | 0 | 0 | 0 | 0 |

In this table, the value "R" is the logical AND of the parameter higain and the control input cnvhgres_i.

Main Integration Phase

Figure 7:
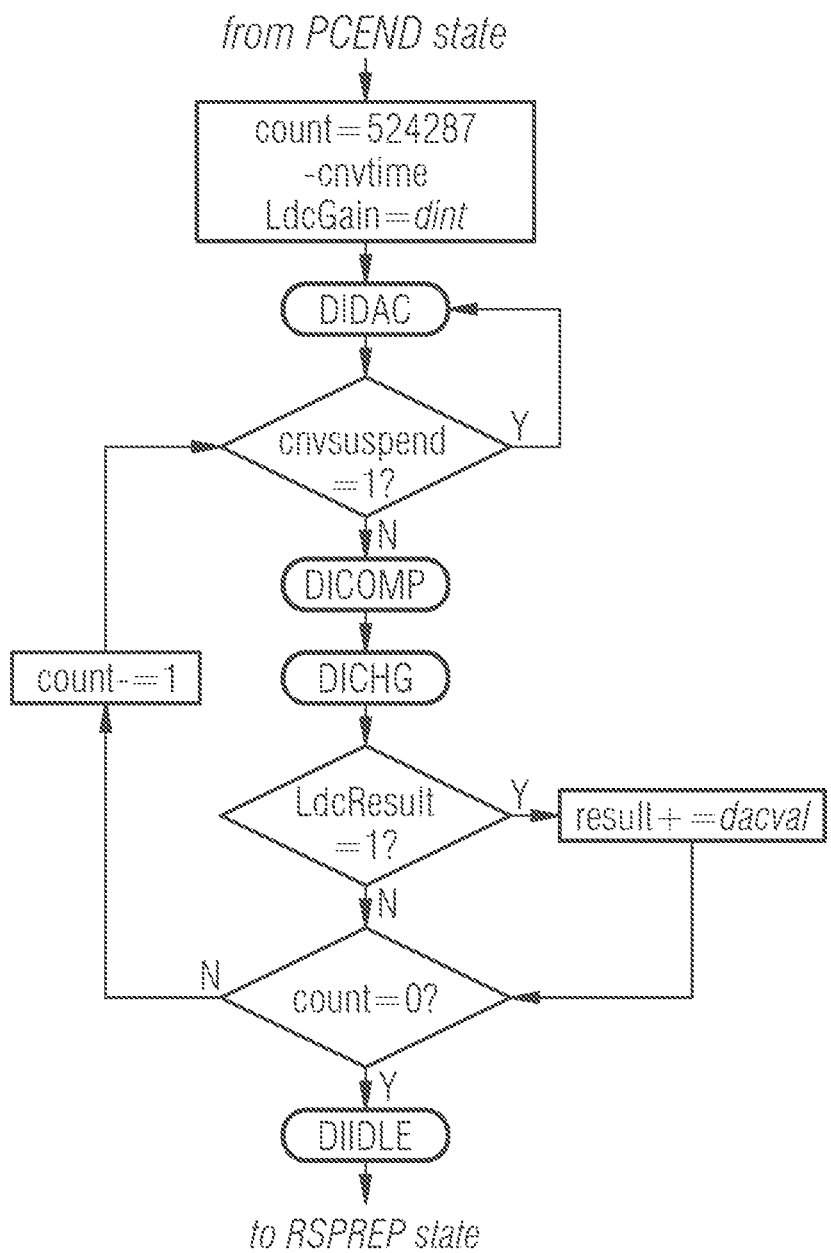
FIG. 7 shows a state machine diagram to sequence the configurations during the main integration phase.

The diode integration states are where the diode current measurement occurs. The state diagram for these states is shown in FIG. 7.

Following the PCEND state from the pre-charge phase, the DAC voltage is set for the main integration by setting LdcGain to dint. (The dint parameter is determined by the cnvgain value according to the table in the previous section.) In addition, the cycle counter is set to $(2^{19}-1-\text{cnvtime})$. Unless the cnvsuspend_i signal is high, the LDC controller then enters the DIDAC state for one clock, allowing the DAC voltage to settle. While in the DIDAC state, the circuit is placed in the diode idle configuration. If the higain parameter (in that same table) is 1, the low-gain capacitors are disconnected and tied to ground.

After the DIDAC state, the controller enters the main integration loop beginning with the DICOMP state. In the DICOMP state, the circuit is placed in the diode compare configuration, the diode is connected to the integrator summing node, and a comparator decision is requested. It is to be noted that during the diode integration states, the high-resolution comparator amplifier is bypassed in order to save power and reduce the number of states needed. Entering the DICOMP state performs step 1 of the integration phase as described above—connect the photodiode to the integrator summing node. Each time in the loop the DICOMP state also performs step 2 of the integration phase—check if the integrator voltage is above vmid.

Following the DICOMP state is the DICHG state in which the circuit is placed in the diode down charge configuration. If the comparison result indicated that the integrator output voltage was greater than vmid, the charge redistribution capacitor is tied to the summing node and the input of the charge redistribution capacitor is raised to the vdachi value set by the LdcGain value dint. This redistributes a charge that lowers the integrator output voltage. After the DICHG state, if a charge redistribution occurred, the result is incremented by the DAC value that corresponds to dint. This value can be found in Table 1. The DICHG state performs step 3 of the integration phase as described above—apply down charge to lower integrator by 1 "count" and increment result register by 1 "count" if the integrator output voltage was above vmid.

Following the DICHG state, the controller loops back to the DICOMP state unless the cnvsuspend_i signal is high, decrementing the cycle counter until it reaches 0. The counting of the cycle counter determines a desired integration time during which the down charge and count operations are performed in consecutive loops. Once it reaches zero and finishes the last loop, the controller branches to the DIIDLE state. This state places the circuit in the diode idle configuration, disconnects the diode from the summing node, and gives one clock for the charge redistribution from the last DICHG state to settle. This completes the final step of the integration phase as described above—disconnect the photodiode. The next state will be the RSPREP state described in the Residue Computation section below.

If, while in the DICHG state, the cnvsuspend_i signal is high and the count is not yet 0, the controller will exit the DICHG state and jump back to the DIDAC state. There it will hold until the cnvsuspend_i signal goes low. This has the effect of suspending the diode integration in a state in which the controller can resume integrating current without, at least theoretically, losing any charge.

The switch controls for the states in the diode integration group are summarized in Table 3 below.

TABLE 3

| State | cnvdone | LdcFunction | LdcCapGain | LdcCapSample | LdcDiodeEn | LdcInitZ | LdcAccumulate |
|---|---|---|---|---|---|---|---|
| DIDAC | 0 | 1 | G | G | 0 | 1 | 1 |
| DICOMP | 0 | 1 | G | G | 1 | 1 | 1 |
| DICHG | 0 | 1 | G | G | 1 | 1 | 1 |
| DIIDLE | 0 | 1 | G | G | 0 | 1 | 1 |

| State | LdcCompAmplify | LdcCompPoll | LdcDownCharge | LdcUpCharge | LdcForceCharge | LdcLift | LdcCompHighRes |
|---|---|---|---|---|---|---|---|
| DIDAC | 0 | 0 | 0 | 0 | 0 | 0 | 0 |
| DICOMP | 0 | 1 | 0 | 0 | 0 | 0 | 0 |
| DICHG | 0 | 0 | 1 | 0 | 0 | 0 | 0 |
| DIIDLE | 0 | 0 | 0 | 0 | 0 | 0 | 0 |

In this table, the value "G" is the value of the parameter higain.

Residue Computation Phase

Figure 8:
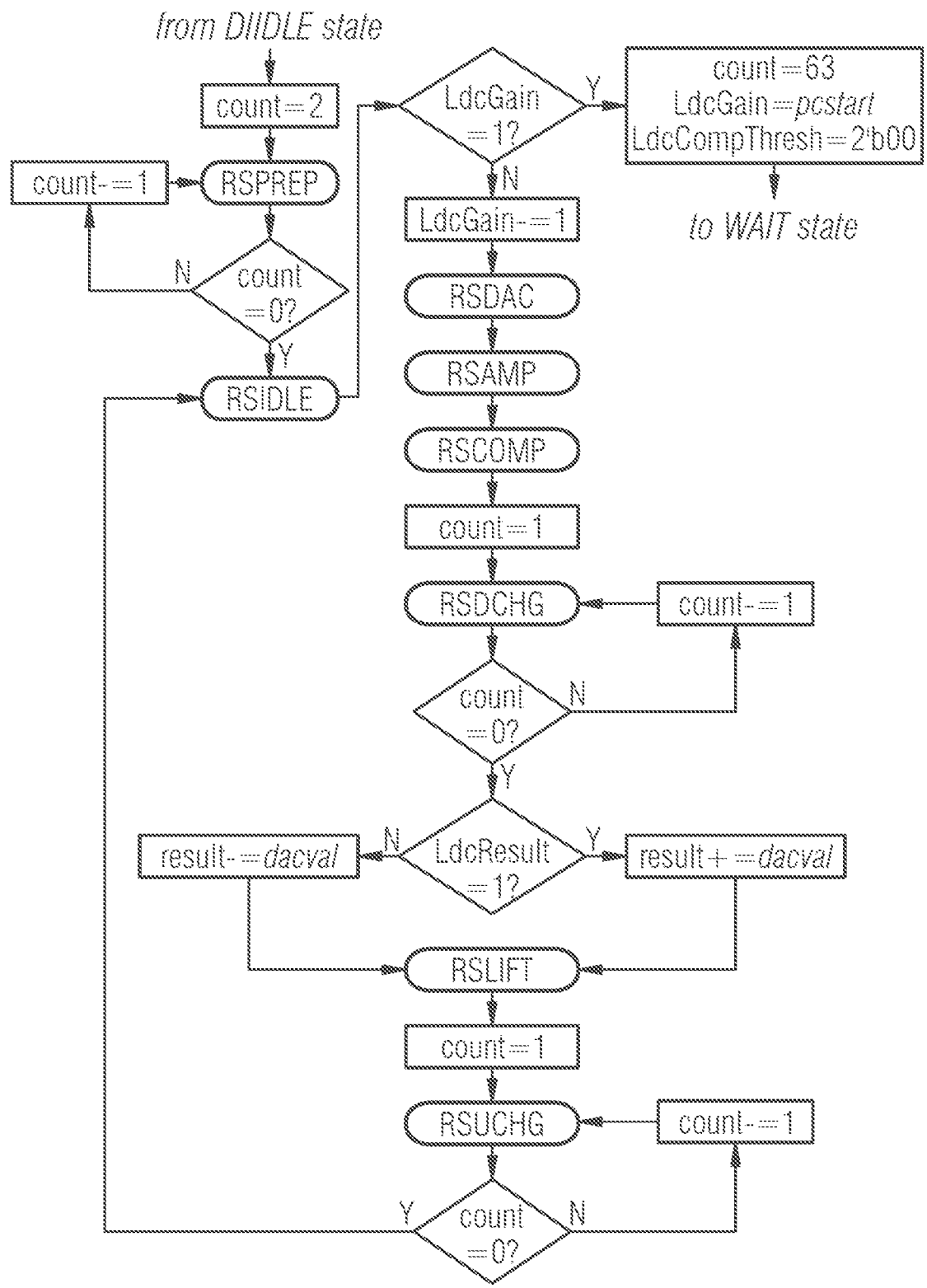
FIG. 8 shows a state machine diagram to sequence the configurations during the residue phase.

The residue computation states are the final phase of the three-phase process to measure the diode current. The purpose of the residue phase is to measure the residual charge left from the diode integration process by returning the integrator output voltage to its starting point, vmid. The state diagram for the residue computation states is shown in FIG. 8.

After leaving the DIIDLE state from the diode integration phase, the LDC controller enters the RSPREP state for three clock cycles. In this state, the circuit is placed in the residue sampling configuration and the integrator output side of both the high and low gain capacitors are connected to the integrator output. The summing node side is left as it was in the diode integration phase. This will sample the integrator output on to both the high and low gain capacitors no matter which gain mode was used during the diode integration. Also during this state, the comparator amplifier is enabled, and the comparator input capacitor is set to sample the comparator voltage vcomp.

After sampling the integrator output voltage, the LDC controller begins the residue computation loop by entering the RSIDLE state. The circuit is placed in the low gain idle configuration. When entering this state from the RSPREP state, the main thing that happens is that the low gain integration capacitor is connected to the summing node, so that the entire residue computation process always happens with the larger, low gain capacitors. The loop counter for the residue loop is the value of the DAC index LdcGain. If the loop is not at the end (which is when LdcGain is 1), the DAC index is decremented, and the residue loop goes to the RSDAC state.

In the RSDAC state, the circuit is placed in the low gain idle configuration and the DAC output vdachi is given one clock to settle before the residue comparison begins. The change in the vdachi value could disturb the vcomp value that is being sampled on to the comparator input capacitor, so this state gives one clock for all of this settling to occur. The controller then goes to the RSAMP state for one clock, where the circuit is placed in the residue amplify configuration, the comparator input capacitor is connected to the integrator output, and the difference between the integrator output and vmid (which is the voltage that was set at vcomp) is amplified. This is followed by the RSCOMP state, also one clock, where the circuit is placed in the residue compare configuration and a comparison decision is made.

After the RSCOMP state, the RSDCHG, RSLIFT, and RSUCHG states are run in sequence. The RSDCHG and RSUCHG states last for two clock periods and the RSLIFT state lasts for one clock period. The behavior of these states depends on the comparator result.

If the integrator output was above vmid, the circuit is placed in the residue down charge configuration, the charge redistribution capacitors are connected to the summing node, and the input to the charge redistribution capacitors is raised to the vdachi value set by the current value of LdcGain. This redistributes a charge that lowers the integrator output voltage. The controller then goes to the RSLIFT and RSUCHG states which act as idle states, where the circuit is placed in the residue down idle configuration and the charge redistribution capacitor is removed from the summing node and discharged. The result value is incremented by the DAC value corresponding to the current value of LdcGain.

If the integrator output was below vmid, the integrator output voltage is raised. To accomplish this without leaking charge through the summing node switches, the reference node of the integrator is raised to vlift during the RSDCHG and RSLIFT states. In the RSDCHG state, the circuit is placed in the residue lift prepare configuration and the vdachi voltage is sampled on to the charge redistribution capacitors. That is followed by the RSLIFT state, where the circuit is placed in the residue lift charge configuration and the charge redistribution capacitors are connected to the summing node and the input of the charge redistribution capacitors are discharged to ground. As a last step, the controller goes to the RSUCHG state, where the circuit is placed in the residue up charge configuration, the reference node is returned to ground, and the charge redistribution to raise the integrator output voltage is completed. The result value is decremented by the DAC value corresponding to the current value of LdcGain. The residue loop employs a successive approximation algorithm. This completes one iteration of steps 1 and 2 described above—use a ½ bit per step algorithm to compute the remaining charge on the integrator output, and update the result register by an amount proportional to the charge applied. The ½ bit per step progression is controlled by the scaling voltages controlled by LdcGain, as shown in Table 5.

After the RSUCHG state completes, the LDC controller returns to the RSIDLE state to allow the charge redistribution to complete before changing the DAC value. After the RSIDLE state, if this is the last pass through the residue loop, the LdcGain index is set to pcstart and the internal LDC result register now holds the final result of the diode current measurement. The cycle counter is set to the "warm" start value of 63, and the controller jumps back to the WAIT state.

Adding the time of the various residue computation states, the total number of clocks used by the residue states is (9 dint−5), where dint determines the number of loops in the residue algorithm. The parameter dint in turn depends on the gain setting cnvgain. Table 1 above lists the various parameters that are derived from cnvgain, including the dint parameter and the number of clocks used in the residue computation states.

The switch controls for the states in the residue computation group are summarized in Table 4 below.

TABLE 4

| State | cnvdone | LdcFunction | LdcCapGain | LdcCapSample | LdcDiodeEn | LdcInitZ | LdcAccumulate |
|---|---|---|---|---|---|---|---|
| RSPREP | 0 | 1 | R | G | 0 | 1 | 1 |
| RSIDLE | 0 | 1 | R | R | 0 | 1 | 1 |
| RSDAC | 0 | 1 | R | R | 0 | 1 | 1 |
| RSAMP | 0 | 1 | R | R | 0 | 1 | 1 |
| RSCOMP | 0 | 1 | R | R | 0 | 1 | 1 |
| RSDCHG | 0 | 1 | R | R | 0 | 1 | 1 |
| RSLIFT | 0 | 1 | R | R | 0 | 1 | 1 |
| RSUCHG | 0 | 1 | R | R | 0 | 1 | 1 |

TABLE 4-continued

| State | LdcCompAmplify | LdcCompPoll | LdcDownCharge | LdcUpCharge | LdcForceCharge | LdcLift | LdcCompHighRes |
|---|---|---|---|---|---|---|---|
| RSPREP | 0 | 0 | 0 | 0 | 0 | 0 | 1 |
| RSIDLE | 0 | 0 | 0 | 0 | 0 | 0 | 1 |
| RSDAC | 0 | 0 | 0 | 0 | 0 | 0 | 1 |
| RSAMP | 1 | 0 | 0 | 0 | 0 | 0 | 1 |
| RSCOMP | 1 | 1 | 0 | 0 | 0 | 0 | 1 |
| RSDCHG | 1 | 0 | 1 | 0 | 1 | 1 | 1 |
| RSLIFT | 1 | 0 | 0 | 1 | 0 | 1 | 1 |
| RSUCHG | 1 | 0 | 0 | 1 | 0 | 0 | 1 |

In this table, the value "G" is the value of the parameter higain and the value "R" is the logical AND of the parameter higain and the control input cnvhgres_i.

Switch Control Signals

Figure 9A:
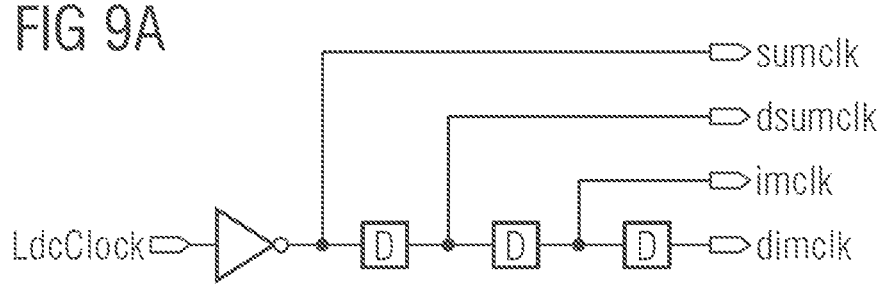
FIGS. 9A through 9I show circuits to generate switch control signals to operate the core analog circuit of FIG. 2.

The switch control signals listed in the table above are converted into phased, non-overlapping switch enables using the circuits shown in FIGS. 9A to 9I. The LDC operates on the falling edge of the main controller clock. The switch controls must be configured such that unintentional charge sharing does not occur. In addition, there are nodes that are very sensitive, and need to be switched at a different time than the rest of the nodes. Therefore, two pairs of a clock and a delayed clock are generated. Switches that are changing are opened on one of the pair's non-delayed clock and closed on that pair's delayed clock. The delay amount is nominally 5 ns. The variation over PVT must be such that, for a given clock pair, all switches that are opening must completely open before any new switches close. Conceptually, the clock pair generation circuit is shown in FIG. 9A.

Both of the clock pairs start with the inverse of the main controller clock. This is to both give a half clock period of timing slop between the logic embedded in the analog circuits and the synthesized digital logic, and to have the switching occur on the less noisy edge of the clock. The sensitive node signals use the sumclk/dsumclk pair. The other nodes use the imclk/dimclk pair. Other signals are in the original LdcClock domain.

Figure 9B:
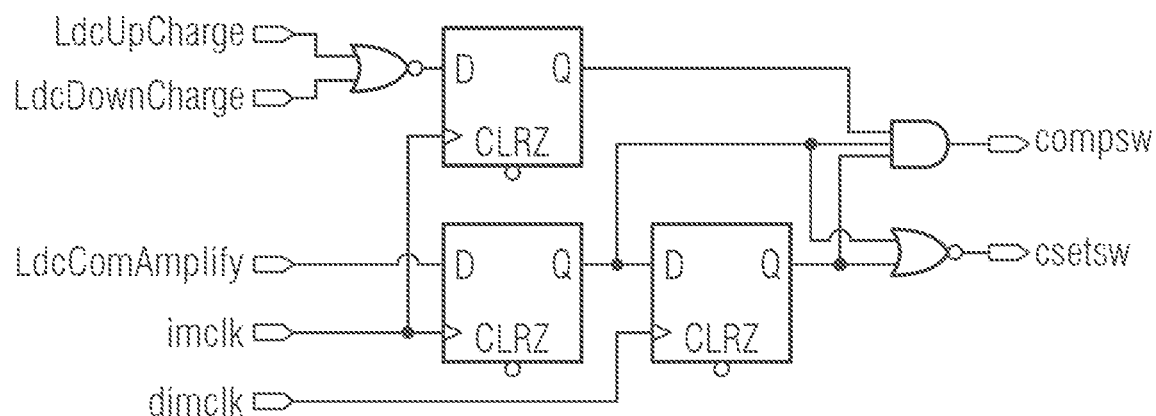

The comparator input control switches, csetsw and compsw, are mainly controlled by LdcCompAmplify, but compsw is also disabled when LdcDownCharge or LdcUpCharge are high, as shown in FIG. 9B.

Figure 9C:
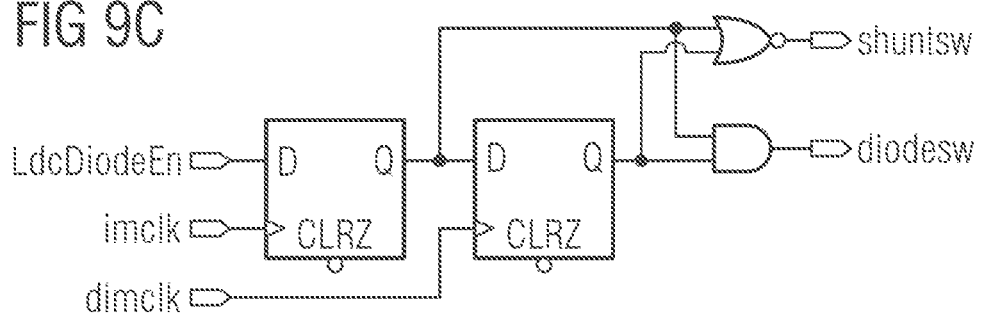
Figure 9D:
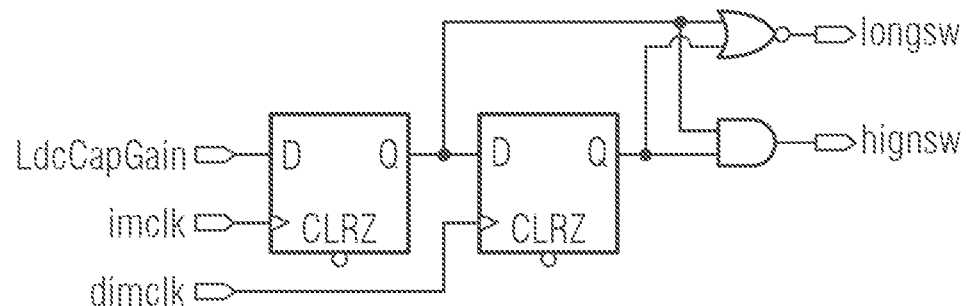
Figure 9E:
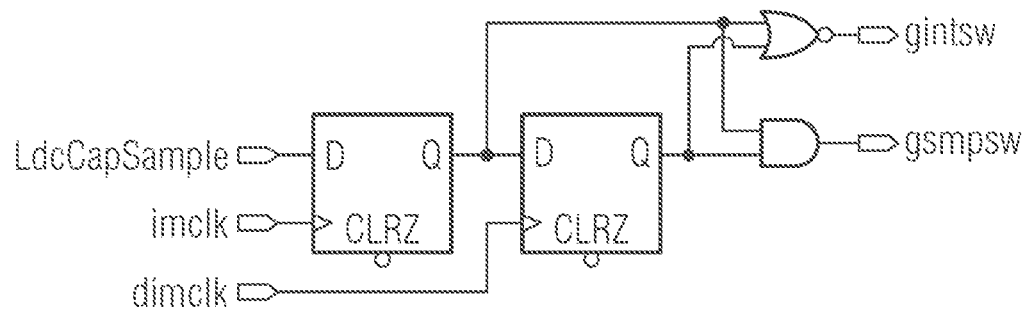

The diode and integrator gain switches are all simple non-overlapping pairs generated from LDC controller signals, as shown in FIG. 9C, FIG. 9D and FIG. 9E.

Figure 9F:
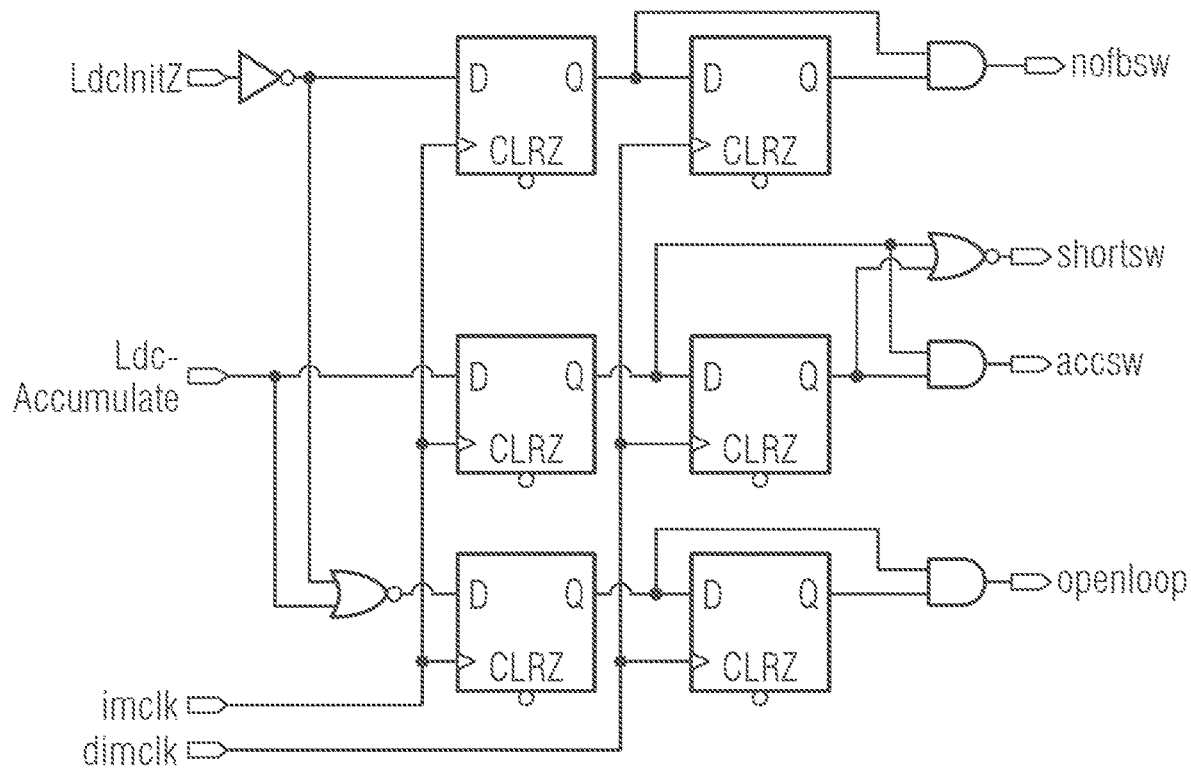

The nofbsw switch is enabled if LdcInitZ is low. The accsw and shortsw signals are non-inverted and inverted non-overlapping versions of LdcAccumulate. The openloop signal is true when LdcAccumulate is low and LdcInitZ is high. The combined logic is illustrated in FIG. 9F.

Figure 9G:
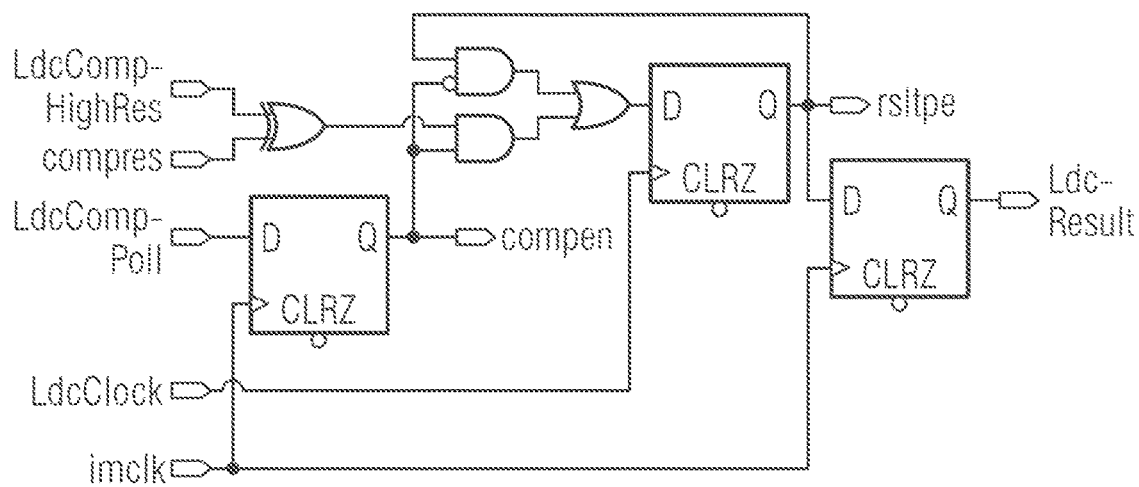

The latching comparator is enabled on the falling edge of the main clock when LdcCompPoll is high, and the result is captured and held on the rising edge. This capture result is recaptured on the falling edge of the main clock before being fed back to the LDC controller to enable relaxed timing requirements. The comparator result is inverted if the high resolution comparator amplifier is enabled, in order to account for the inversion due to that amplifier. The circuit concept for this is shown in FIG. 9G.

Figure 9H:
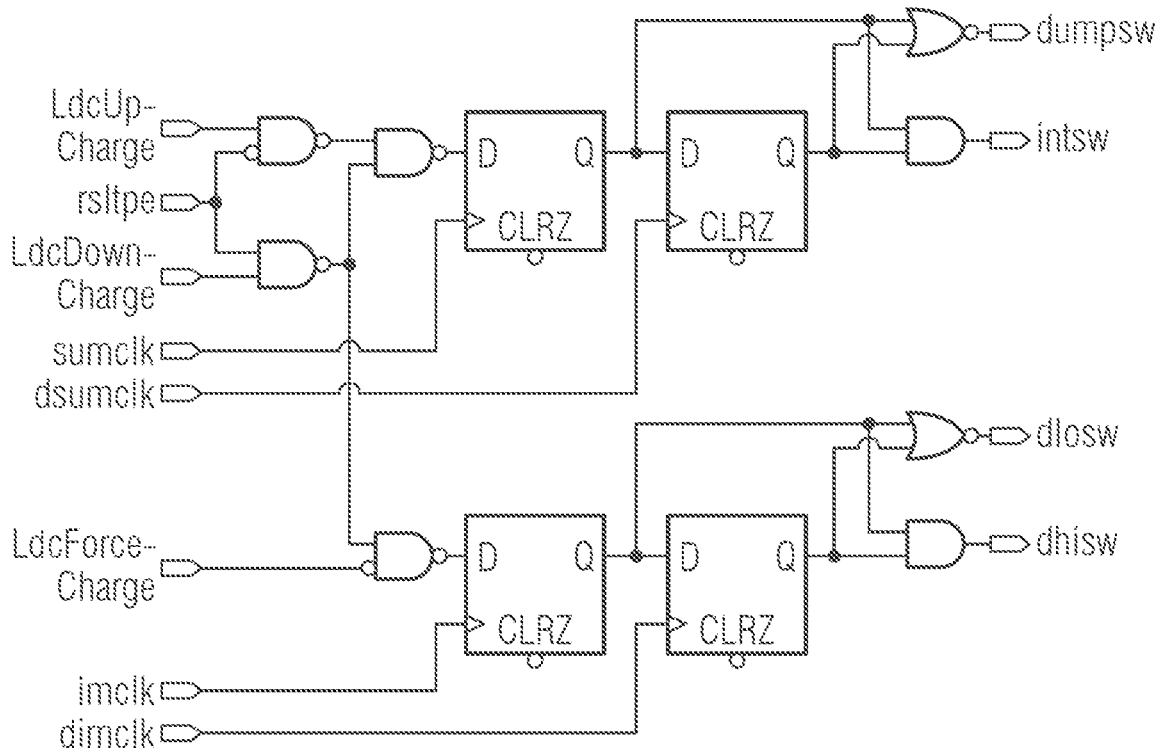

The comparator result is combined with control signals from the LDC controller to generate the switch signals for the charge redistribution capacitor, using the circuit depicted in FIG. 9H. It is to be noted that the intsw and dumpsw signals are timed with the sensitive node clock pair.

Figure 9I:
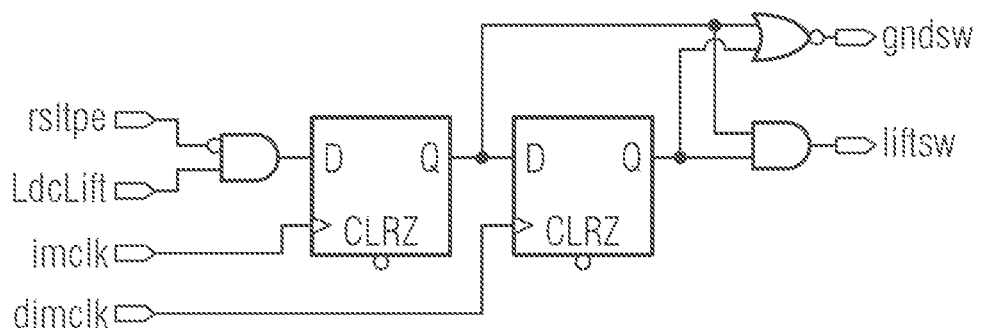

The lift switch control is enabled if LdcLift is high and the comparator result was low, using the circuit in FIG. 9I.

DAC Circuit

Figure 10:
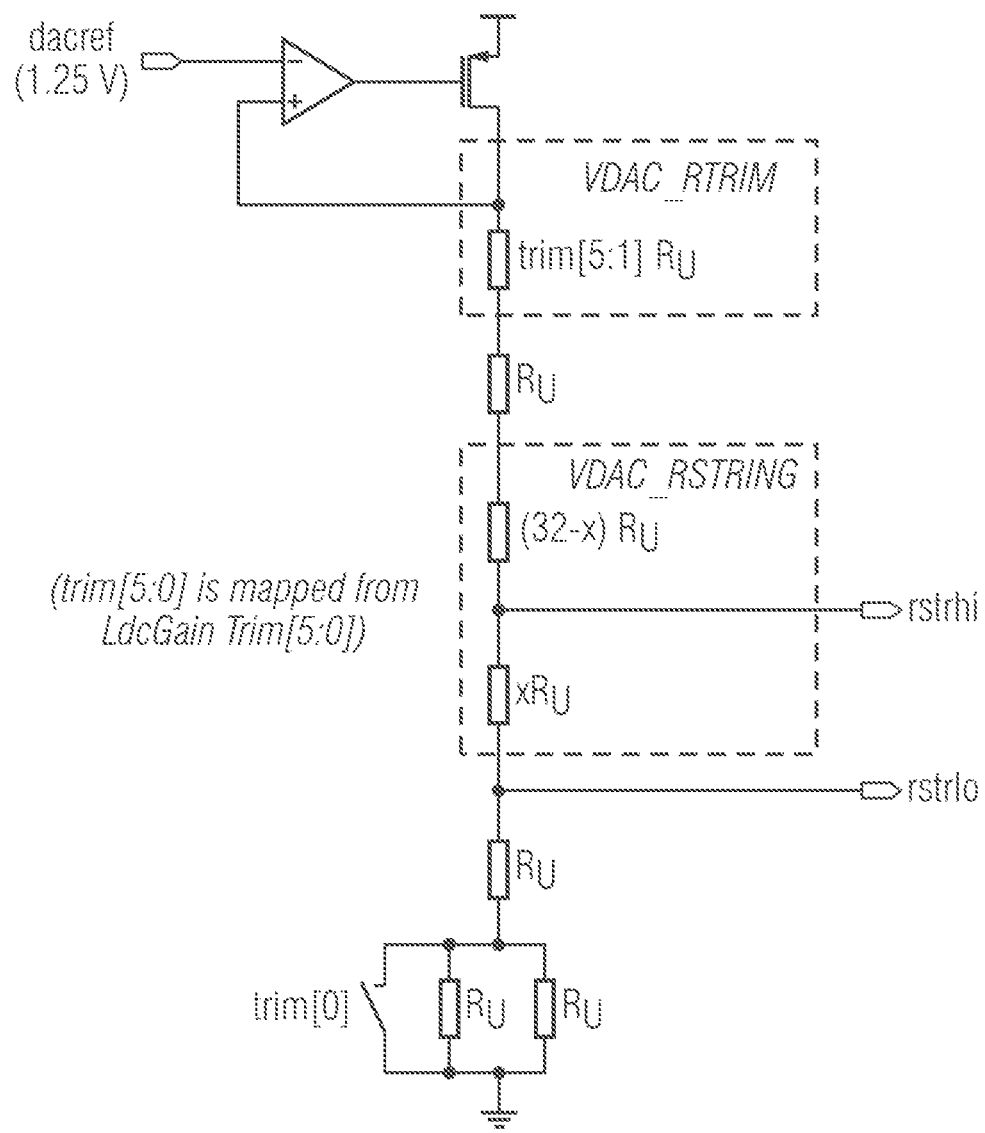
FIGS. 10 through 12 show digital-to-analog converter circuits to generate the vdachi signal used in the core analog circuit of FIG. 2.

The analog circuit that drives the vdachi signal is the voltage DAC. The circuit diagram shown in FIG. 10 depicts the overall conceptual structure of the DAC (digital-to-analog converter) circuit.

The voltage difference between the rstrhi and rstrlo nodes, $V_{DAC}$, will be given by the formula $$V_{DAC}(x) = \frac{xV_{REF}}{34 + \frac{trim}{2}} \quad (1)$$

where $V_{REF}$ is the reference voltage at dacref (nominally 1.25 V) and trim is a mapped version of LdcGainTrim[5:0]. It will be shown below that the LSB DAC voltage, $V_{LSB}$, is equal to $V_{DAC}(1/16)$. The nominal trim[5:0] value is 32. Therefore, the nominal LSB voltage is 1250/(50×16)=1.56 mV. From equation (1), it is seen that the LDC gain is inversely proportional to the LSB voltage. In the example, the gain is proportional to the trim value, as desired.

The LdcGainTrim value is mapped to trim in a sign-magnitude fashion. If LdcGainTrim[5] is 0, the trim mapping is 32+LdcGainTrim[4:0]. Thus, an LdcGainTrim setting of 0 is the nominal trim setting, and the fractional gain trim adjustment for other LdcGainTrim values when LdcGainTrim[5] is 0 is (1+LdcGainTrim[4:0]/100). In other words, each increment of LdcGainTrim results in a 1% increase in the LDC gain.

If LdcGainTrim[5] is 1, the trim mapping is 32−LdcGainTrim[4:0]. The fractional gain trim adjustment is (1−LdcGainTrim[4:0]/100), so each increment of LdcGainTrim results in a 1% decrease in the LDC gain.

Gain Trim Resistor String

Figure 11:
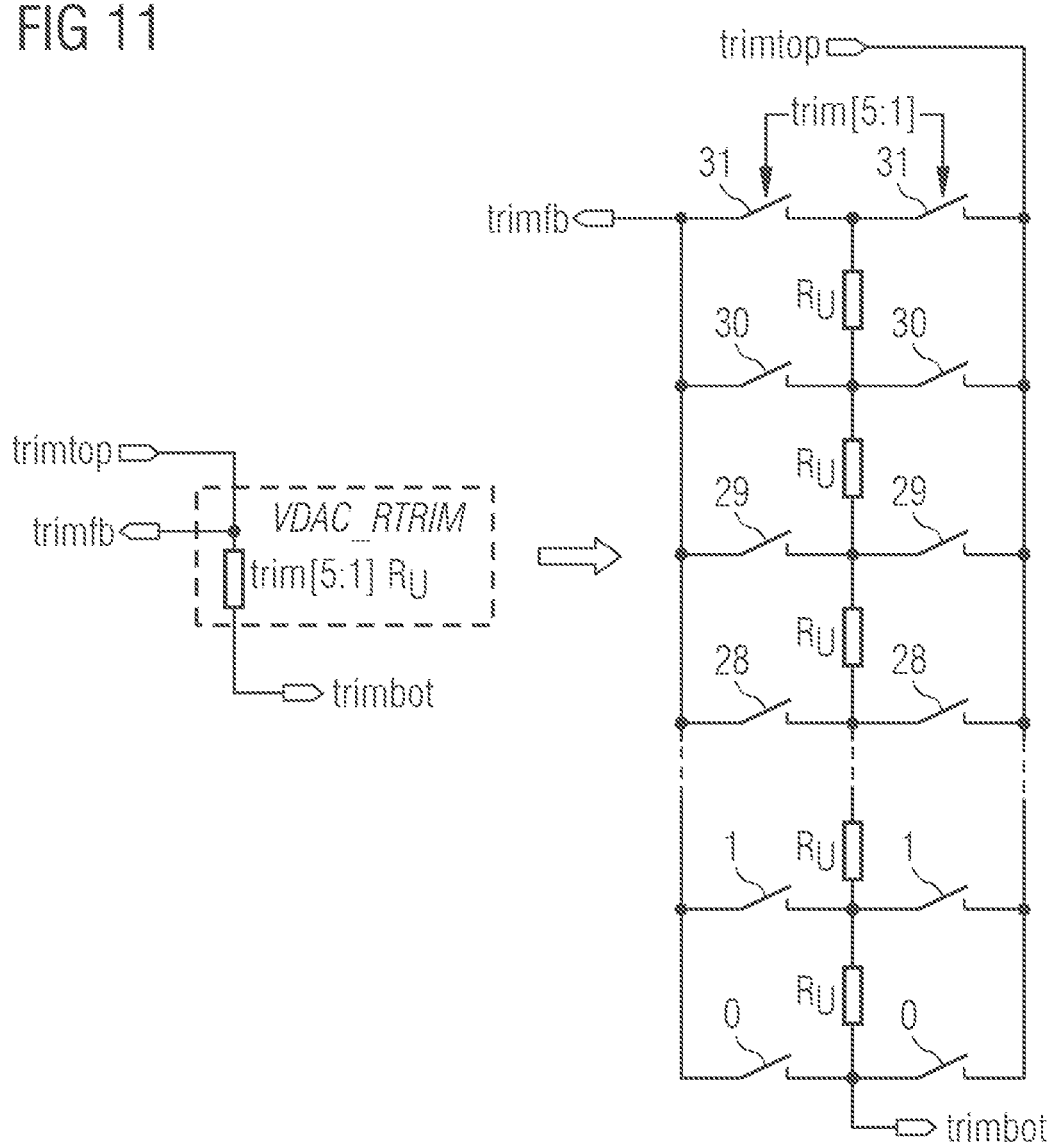

The conceptual circuit diagram for the gain trim resistor string is shown in FIG. 11.

One important feature of this structure is the double-switch topology. This insures that the feedback tap to the amplifier input does not have any DC current, so there is no DC voltage error due to finite switch resistance.

DAC Charge Redistribution Resistor String

Figure 12:
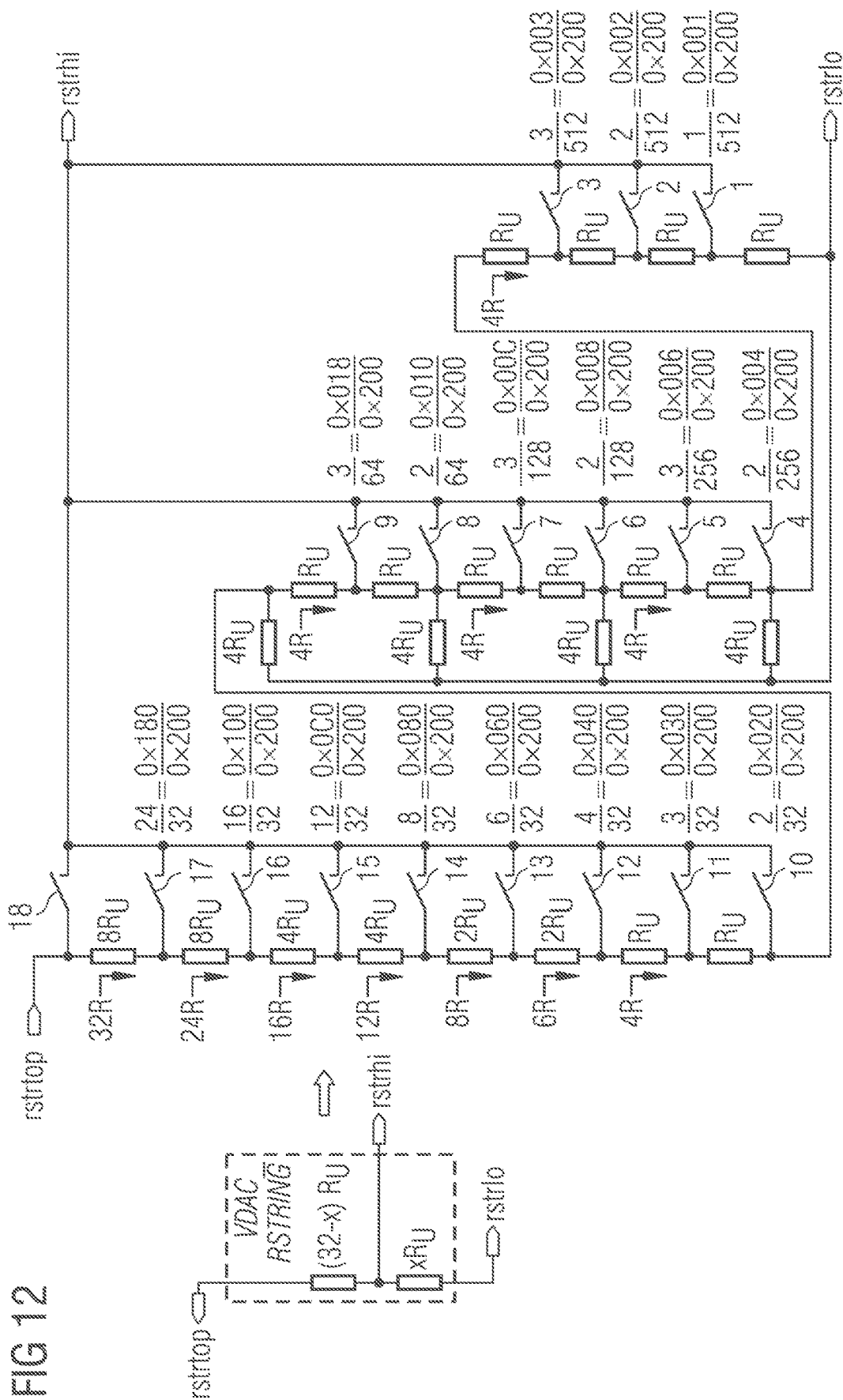

A conceptual circuit diagram of the DAC charge redistribution resistor string is shown in FIG. 12.

The numbers above the switches correspond to the LdcGain[4:0] value that connects that switch. For the larger DAC voltages, the circuit is just a simple tapped resistor string. For the smaller DAC voltages, an R-2R ladder structure is used. This allows fractional values of "x" to be generated in the $V_{DAC}(x)$ formula. Table 5 below lists the various DAC voltages that can be generated. The first column is the LdcGain value. The second column is the effective tap value, that is, the value of "x". The third column is the DAC voltage relative to the LSB voltage. The fourth column is the voltage $V_{DAC}(x)$, assuming a nominal gain trim. The fifth column is the LDC gain setting that uses the tap point for the charge redistribution during the main integration.

TABLE 5

| LdcGain | DAC Tap | DAC Value | Nominal DAC Voltage (mV) | Gain Setting |
|---------|---------|-----------|--------------------------|--------------|
| 18 | 32 | 512 | 800 | 1×, 16× |
| 17 | 24 | 384 | 600 | |
| 16 | 16 | 256 | 400 | 2×, 32× |
| 15 | 12 | 192 | 300 | |
| 14 | 8 | 128 | 200 | 4×, 64× |
| 13 | 6 | 96 | 150 | |
| 12 | 4 | 64 | 100 | 8×, 128× |
| 11 | 3 | 48 | 75 | |
| 10 | 2 | 32 | 50 | 256× |
| 9 | 3/2 | 24 | 37.5 | |
| 8 | 1 | 16 | 25 | 512× |
| 7 | 3/4 | 12 | 18.75 | |
| 6 | 1/2 | 8 | 12.5 | |
| 5 | 3/8 | 6 | 9.38 | |
| 4 | 1/4 | 4 | 6.25 | |
| 3 | 3/16 | 3 | 4.69 | |
| 2 | 1/8 | 2 | 3.13 | |
| 1 | 1/16 | 1 | 1.56 | |

The method and the arrangement according to the present disclosure employ one or more of the following:

Use of a successive approximation algorithm to measure the integrator residue.

Use of a ½ bit per step algorithm for error correction.

Use of a sampling step at the beginning of the residue phase to always allow the use of the larger capacitors during the residue phase.

Use of a lift step during "up-charge" steps to prevent forward biasing of drain/source to well diodes.

Use of a pre-charge phase to mimic the residue phase and reduce the offset sensitivity of the residue measurement.

Figure 13:
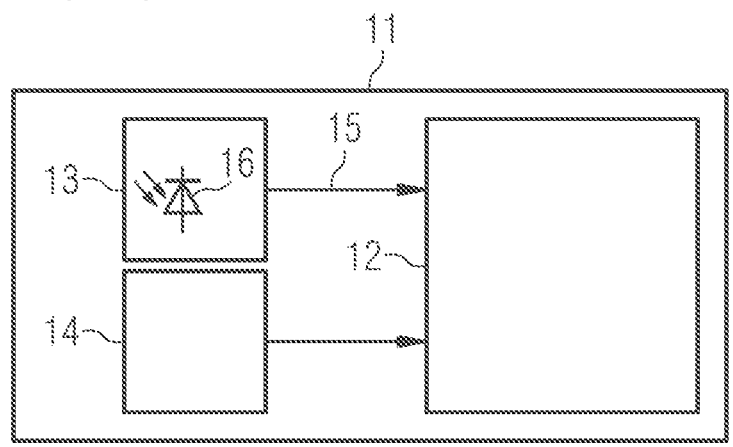
FIG. 13 shows a mobile computing device including the circuit of FIG. 1.

FIG. 13 depicts a technical application of the optical sensor arrangement of the present disclosure. FIG. 13 shows a mobile computing device 11 such as a tablet computer or a smartphone. Device 11 includes a display screen 12 which displays information generated by a processor 14. The light sensor 13 controls the brightness of the display 12 in response to the ambient light sensing function 16 of the device 13 to achieve a convenient appearance of the display to the user. The light sensor 13 comprises an output terminal 15 that provides a signal indicative of the ambient light to control the brightness of the display. The light sensor 13 is realized according to the principles described hereinabove and operates according to the methods described hereinabove. The improved accuracy of the light sensor 13 allows a more accurate and faster brightness control so that use of the device is more convenient.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

The invention claimed is:

1. A method to operate an optical sensor arrangement, the optical sensor arrangement comprising:
   a photodiode;
   a converter arrangement, comprising:
      an integration amplifier and a comparator amplifier;
      an integration capacitor coupled to an input of the integration amplifier;
      a comparator capacitor coupled to an input of the comparator amplifier;
   a controller to operate the converter arrangement; and
   a result register;
   the method comprising performing:
      a precharge phase to set the result register to a starting value;
      an integration phase to sample a current through the photodiode and update the result register in response to down charges applied to an input of the integration amplifier; and
      a residue phase to update the result register in dependence on the charge remaining on the integration capacitor,
   wherein the method further comprises at least one of performing a precharge phase or performing a residue phase,
   the performing a precharge phase comprises:
      setting an output of the integration amplifier to a reference potential;
      applying a predetermined charge to change the potential at the output of the integration amplifier;
      performing a search algorithm to return the output of the integrator to the reference potential; and
      applying another predetermined charge to change the potential at the output of the integration amplifier and setting the result register in response to the other predetermined charge,
   the performing a residue phase comprises:
      performing a search algorithm to return the output of the integrator to a reference potential; and
      applying a predetermined charge to change the potential at the output of the integrating amplifier and setting the result register in response to the predetermined charge.

2. The method according to claim 1, wherein performing a precharge phase further comprises:
   applying a down charge to the input of the integration amplifier and performing a ½ bit per step search algorithm to return the output of the integrator to the reference potential.

3. The method according to claim 1, wherein applying a predetermined charge comprises applying a down charge to lower the output of the integration amplifier by ¼ count and applying another predetermined charge comprises applying a down charge to lower the output of the integration amplifier by ½ count and setting the result register to +0.5 counts.

4. The method according to claim 1, wherein performing an integration phase comprises:
   connecting the photodiode to the input of the integration amplifier;
   comparing the output of the integration amplifier with a reference potential; and
   updating the result register in response to the comparing.

5. The method according to claim 4, wherein performing an integration phase comprises repetitively performing comparing the output of the integration amplifier with a reference potential and changing the result register during a predetermined integration time.

6. The method according to claim 1, wherein performing a residue phase further comprises:
performing a ½ bit per step search algorithm to return the output of the integrator to the reference potential and updating the result register by an amount proportional to one of an up charge and a down charge applied to the input of the integration amplifier during the step of performing a ½ bit per step search algorithm.

7. The method according to claim 2, wherein the step of performing a ½ bit per step search algorithm to return the output of the integrator to the reference potential comprises:
connecting the comparator capacitor to the output of the integration amplifier and comparing an output signal of the integration amplifier with a reference potential;
applying one of a down charge and an up charge and, in dependence on the result of comparing, applying a lift potential to another input of the integration amplifier.

8. An optical sensor arrangement, comprising:
a photodiode;
a converter arrangement, comprising:
an integration amplifier and a comparator amplifier;
an integration capacitor coupled to an input of the integration amplifier;
a comparator capacitor coupled to an input of the comparator amplifier;
a controller to operate the converter arrangement; and
a result register;
the converter arrangement configured to
set the result register to a starting value during a precharge phase;
update the result register in response to down charges applied to an input of the integration amplifier in response to sampling a current through the photodiode during an integration phase; and
update the result register in dependence on the charge remaining on the integration capacitor during a residue phase, wherein
the converter arrangement is configured to perform a search algorithm to return an output of the integration amplifier to a reference potential during the precharge phase and during the residue phase, and/or
the converter arrangement is configured to adopt one or more of a residue down charge configuration, a residue up charge configuration and a residue lift charge configuration during the precharge phase and during the residue phase.

9. The optical sensor arrangement according to claim 8, wherein, in the residue down charge configuration, a charge redistribution capacitor is connected to the input of the integration amplifier and to a reference potential and another input of the integration amplifier is connected to ground potential.

10. The optical sensor arrangement according to claim 8, wherein, in the residue up charge configuration, a charge redistribution capacitor is connected to the input of the integration amplifier and to ground potential and another input of the integration amplifier is connected to ground potential.

11. The optical sensor arrangement according to claim 8, wherein, in the residue lift charge configuration, a charge redistribution capacitor is connected to ground potential and to the input of the integration amplifier and another input of the integration amplifier is connected to a lift potential.

12. The optical sensor arrangement according to claim 8, wherein the converter arrangement is configured to perform a precharge phase comprising:
setting an output of the integration amplifier to a reference potential;
applying a predetermined charge to change the potential at the output of the integration amplifier by applying a down charge to the input of the integration amplifier to lower the output of the integration amplifier by a first count value;
performing a search algorithm to return the output of the integrator to the reference potential by performing a search algorithm to return the output of the integrator to the reference potential; and
applying another predetermined charge to change the potential at the output of the integration amplifier by applying a down charge to lower the output of the integration amplifier by a second count value and setting the result register in response to the other predetermined charge;
wherein the converter arrangement is configured to perform an integration phase comprising:
connecting the photodiode to the input of the integration amplifier;
comparing the output of the integration amplifier with the reference potential; and
updating the result register in response to the step of comparing; and
wherein the converter arrangement is configured to perform a residue phase comprising:
performing a search algorithm to return the output of the integrator to the reference potential; and
applying a predetermined charge to change the potential at the output of the integrating amplifier and setting the result register in response to the predetermined charge.

13. The optical sensor arrangement according to claim 12, wherein the first count value is represented by ¼ count, the second count value is represented by ½ count, the search algorithm comprises a ½ bit per step search algorithm and the setting of the result register in response to the other predetermined charge comprises setting the result register to +0.5 counts.

14. The method according to claim 1, wherein performing a precharge phase comprises:
setting an output of the integration amplifier to a reference potential;
applying a predetermined charge to change the potential at the output of the integration amplifier by applying a down charge to the input of the integration amplifier to lower the output of the integration amplifier by a first count value;
performing a search algorithm to return the output of the integrator to the reference potential by performing a search algorithm to return the output of the integrator to the reference potential; and
applying another predetermined charge to change the potential at the output of the integration amplifier by applying a down charge to lower the output of the integration amplifier by a second count value and setting the result register in response to the other predetermined charge;
wherein performing an integration phase comprises:
connecting the photodiode to the input of the integration amplifier;
comparing the output of the integration amplifier with the reference potential; and
updating the result register in response to the comparing; and wherein performing a residue phase comprises:
performing a search algorithm to return the output of the integrator to the reference potential; and
applying a predetermined charge to change the potential at the output of the integrating amplifier and setting the result register in response to the predetermined charge.

15. The method according to claim 14, wherein the first count value is represented by ¼ count, the second count value is represented by ½ count, the search algorithm comprises a ½ bit per step search algorithm and the setting of the result register in response to the other predetermined charge comprises setting the result register to +0.5 counts.

16. An optical sensor arrangement, comprising:
a photodiode;
a converter arrangement, comprising:
  an integration amplifier and a comparator amplifier;
  an integration capacitor coupled to an input of the integration amplifier;
  a comparator capacitor coupled to an input of the comparator amplifier;
a controller to operate the converter arrangement; and
a result register;
the converter arrangement configured to
  set the result register to a starting value during a precharge phase;
  update the result register in response to down charges applied to an input of the integration amplifier in response to sampling a current through the photodiode during an integration phase; and
  update the result register in dependence on the charge remaining on the integration capacitor during a residue phase,
wherein the converter arrangement is configured to perform a precharge phase comprising:
setting an output of the integration amplifier to a reference potential;
applying a predetermined charge to change the potential at the output of the integration amplifier by applying a down charge to the input of the integration amplifier to lower the output of the integration amplifier by a first count value;
performing a search algorithm to return the output of the integrator to the reference potential by performing a search algorithm to return the output of the integrator to the reference potential; and
applying another predetermined charge to change the potential at the output of the integration amplifier by applying a down charge to lower the output of the integration amplifier by a second count value and setting the result register in response to the other predetermined charge;
wherein the converter arrangement is configured to perform an integration phase comprising:
connecting the photodiode to the input of the integration amplifier;
comparing the output of the integration amplifier with the reference potential; and
updating the result register in response to the step of comparing; and
wherein the converter arrangement is configured to perform a residue phase comprising:
performing a search algorithm to return the output of the integrator to the reference potential; and
applying a predetermined charge to change the potential at the output of the integrating amplifier and setting the result register in response to the predetermined charge.

17. The optical sensor arrangement according to claim 16, wherein the first count value is represented by ¼ count, the second count value is represented by ½ count, the search algorithm comprises a ½ bit per step search algorithm and the setting of the result register in response to the other predetermined charge comprises setting the result register to +0.5 counts.

* * * * *